United States Patent
Ito et al.

(10) Patent No.: US 7,060,581 B2
(45) Date of Patent: Jun. 13, 2006

(54) METHOD FOR MANUFACTURING A SEMICONDUCTOR DEVICE

(75) Inventors: Takayuki Ito, Kawasaki (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/960,140

(22) Filed: Oct. 8, 2004

(65) Prior Publication Data

US 2005/0112854 A1    May 26, 2005

(30) Foreign Application Priority Data

Oct. 9, 2003    (JP)    ............................ P2003-350387

(51) Int. Cl.
*H01L 21/336*    (2006.01)
(52) U.S. Cl. ...................... 438/307; 438/257
(58) Field of Classification Search ................ 438/183, 438/257, 296, 305, 306, 307, 425, 595
See application file for complete search history.

(56) References Cited

U.S. PATENT DOCUMENTS

| | | | |
|---|---|---|---|
| 3,966,501 A * | 6/1976 | Nomura et al. | 438/442 |
| 5,620,905 A * | 4/1997 | Konuma et al. | 438/163 |
| 6,054,355 A * | 4/2000 | Inumiya et al. | 438/296 |
| 6,613,621 B1 * | 9/2003 | Uh et al. | 438/183 |
| 2003/0193066 A1 | 10/2003 | Ito et al. | 257/335 |

FOREIGN PATENT DOCUMENTS

| | | |
|---|---|---|
| JP | 2000-138177 | 5/2000 |
| JP | 2000-150668 | 5/2000 |
| JP | 2002-141298 | 5/2002 |
| JP | 2002-246329 | 8/2002 |
| JP | 2002-299616 | 10/2002 |

OTHER PUBLICATIONS

U.S. Patent Application for Kyoichi Suguro et al., U.S. Appl. No. 10/661,564, filed Sep. 15, 2003.

* cited by examiner

*Primary Examiner*—Phuc T. Dang
(74) *Attorney, Agent, or Firm*—Finnegan, Henderson, Farabow, Garrett & Dunner, L.L.P.

(57) ABSTRACT

A method for manufacturing a semiconductor device, includes forming a first impurity implanted layer in a semiconductor substrate by selectively implanting ions of a first impurity. A dummy pattern is formed on a surface of the semiconductor substrate above the first impurity implanted layer. A second impurity implanted layer is formed in the semiconductor substrate by implanting ions of a second impurity. An interlevel insulating film is buried on the surface of the semiconductor substrate so as to planarize at the level of the dummy pattern. Ions of the first and second impurities are activated by irradiating the semiconductor substrate with a pulsed light at a pulse width of 0.1 ms to 100 ms. An opening is formed by selectively removing the dummy pattern. A gate insulating film and a gate electrode are formed on the exposed surface of the semiconductor substrate.

20 Claims, 20 Drawing Sheets

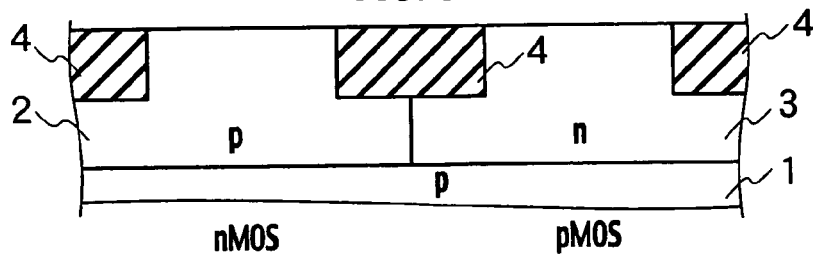
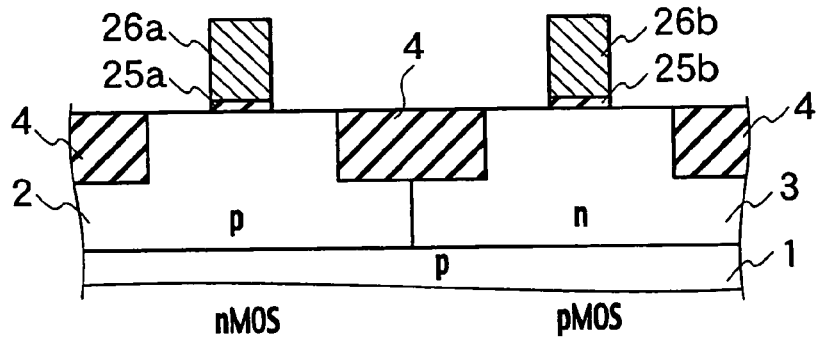
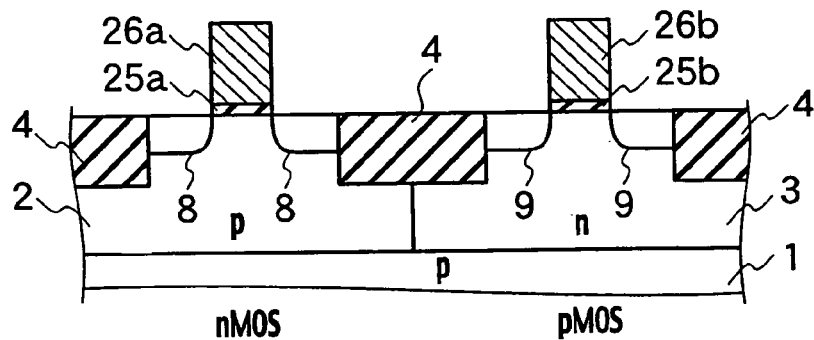
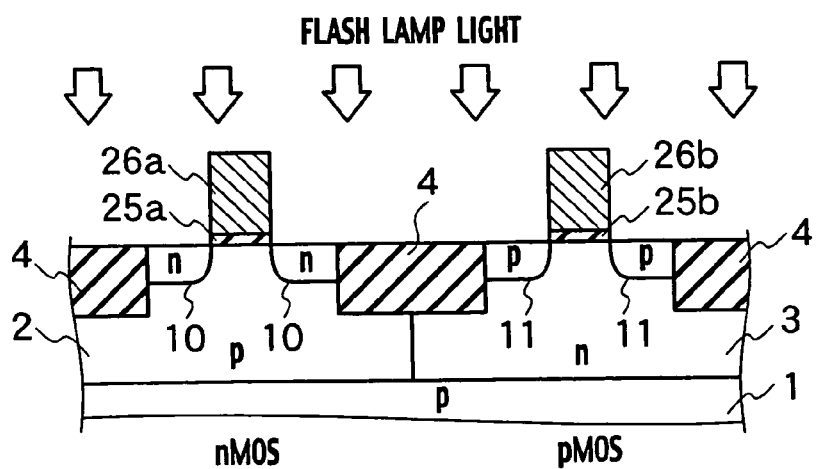

METHOD FOR MANUFACTURING A SEMICONDUCTOR DEVICE

CROSS REFERENCE TO RELATED APPLICATIONS

This application is based upon and claims the benefit of priority from prior Japanese Patent Application P2003-350387 filed on Oct. 9, 2003; the entire contents of which are incorporated by reference herein.

BACKGROUND OF THE INVENTION

1. Field of the Invention

The present invention relates to impurity doping methods for semiconductor devices, and particularly to manufacturing methods of semiconductor devices by annealing methods using high-intensity light sources.

2. Description of the Related Art

Improvements in the performance of large-scale integration (LSI) semiconductor devices can be realized by miniaturizing, or put more plainly, by miniaturizing the elements that compose a semiconductor device. Thus, LSI becomes increasingly more integrated while miniaturization of elements such as metal-oxide-semiconductor (MOS) transistors is being taken to a whole new level. Along with the miniaturization of composing elements, parasitic resistance and short channel effects on-MOS transistors and the like, increase. Thus there is increased importance placed on the formation of low resistance layers and shallow pn junctions.

For forming a shallow pn junction with a thickness of or below twenty nm, a thin impurity doped region is formed using an ion implantation in a semiconductor substrate with low acceleration energy. The impurities doped in the semiconductor substrate are activated by an annealing process, thus forming a shallow impurity diffusion region. In order to lower layer resistance of an impurity diffusion region it is necessary to perform activation annealing of the impurities at a high temperature.

However, the diffusion coefficients of p-type impurities such as boron (B), and n-type impurities such as phosphorus (P) or arsenic (As), in the crystal of the silicon (Si) substrate, are large. In the time needed to perform rapid thermal annealing (RTA) using current halogen lamps, impurities diffuse to both the interior and exterior of a semiconductor substrate. As a result, it is impossible to form a shallow impurity diffusion region having a high concentration of impurities on a semiconductor substrate. Also, it becomes impossible to activate a high concentration of impurities if the temperature of the RTA process is lowered in order to control the diffusion of the impurities. In this manner, it is difficult to form a shallow impurity diffusion region having low resistance and a high concentration of activated impurities.

Impurities such as indium (In) and antimony (Sb) are being tested for use in further miniaturization of semiconductor devices. Compared to impurities such as B, P, and As, In and Sb have higher atomic masses, to achieve a more precipitous impurity distribution by ion implantation at the same acceleration energy. However, the solid solubility limit of substances such as In in Si crystal is low. It becomes necessary to raise annealing temperatures of RTA while further prolonging annealing processing time in order to activate In impurities implanted by ion implantation. As a result, it is impossible to maintain precipitous impurity distribution. Recently a pulse light annealing method using pulse light sources such as a flash lamp or a YAG laser, which can instantly supply the energy essential to impurity activation, is being tested as a solution to the RTA problem. A xenon (Xe) flash lamp has a quartz glass tube filled with Xe gas, in which electrical charges stored in capacitors and the like, are instantaneously discharged. As a result, it becomes possible to illuminate a high intensity white light in a range of several hundred µs to several hundred ms for instance. It is possible to attain heat energy required for impurity activation in the instantaneous heating of a semiconductor substrate absorbing flash lamp light. Therefore, it is possible to activate a high concentration of impurities while leaving the concentration profile of the impurities implanted into the semiconductor substrate virtually unchanged.

Providing a low resistance gate electrode is important in the miniaturization of transistors. In gate electrodes that use polycrystalline silicon (simplified to poly-Si hereinafter), impurities are ion implanted into the gate electrode during the formation of the source-drain regions. The ion implanted impurities are activated by annealing, and diffused throughout the entire gate electrode. However, the period of time used for annealing on flash lamp annealing methods is short, and diffusion of impurities that have been ion implanted into the gate electrode is suppressed. As a result, a poly-Si layer that has a low carrier concentration remains within a gate electrode. A poly-si layer that has a low carrier concentration will deplete a gate electrode. Depletion of a gate electrode increases the effective thickness of a gate insulating film, and invites a drop in the current driving force of a transistor. Stated plainly, by current flash lamp annealing technology, even though an impurity diffusion region having a shallow junction with low resistance is formed, fabrication of a high performance miniature transistor remains a difficulty.

SUMMARY OF THE INVENTION

A first aspect of the present invention inheres in a method for manufacturing a semiconductor device including forming. a first impurity implanted layer in a semiconductor substrate by selectively implanting ions of a first impurity; forming a dummy pattern on a surface of the semiconductor substrate above the first impurity implanted layer; forming a second impurity implanted layer in the semiconductor substrate by implanting ions of a second impurity using the dummy pattern as a mask; burying an interlevel insulating film on the surface of the semiconductor substrate so as to planarize the interlevel insulating film with a level of a thickness of the dummy pattern; activating ions of the first and second impurities by irradiating the surface of the semiconductor substrate with a pulsed light at a pulse width of 0.1 ms to 100 ms; forming an opening by selectively removing the dummy pattern; and forming a gate insulating film and a gate electrode on the surface of the semiconductor substrate exposed in the opening.

A second aspect of the present invention inheres in a method for manufacturing a semiconductor device including forming a gate insulating film on a semiconductor substrate; forming a gate electrode on the gate insulating film; forming an impurity implanted layer in the semiconductor substrate by selectively implanting ions of an impurity using the gate electrode as a mask; and activating ions of the impurity by irradiating a surface of the semiconductor substrate with a pulsed light at a pulse width of 0.1 ms to 100 ms.

A third aspect of the present invention inheres in a method for manufacturing a semiconductor device including forming a dummy pattern on a surface of a semiconductor substrate; forming a first impurity implanted layer in the semiconductor substrate by implanting ions of a first impurity using the dummy pattern as a mask; burying an interlevel insulating film on a surface of the semiconductor substrate so as to planarize the interlevel insulating film with a level of a thickness of the dummy pattern; forming an opening by selectively removing the dummy pattern; forming a second impurity implanted layer in the semiconductor substrate by implanting ions of a second impurity through the opening; activating ions of the first and second impurities by irradiating the surface of the semiconductor substrate with a pulsed light at a pulse width of 0.1 ms to 100 ms; and forming a gate insulating film and a gate electrode on the surface of the semiconductor substrate exposed in the opening.

BRIEF DESCRIPTION OF DRAWINGS

FIGS. 35 to 41 are cross sectional views showing an example of a manufacturing process of a semiconductor device using an impurity doping method according to the third embodiment of the present invention.

DETAILED DESCRIPTION OF THE INVENTION

Figure 1:
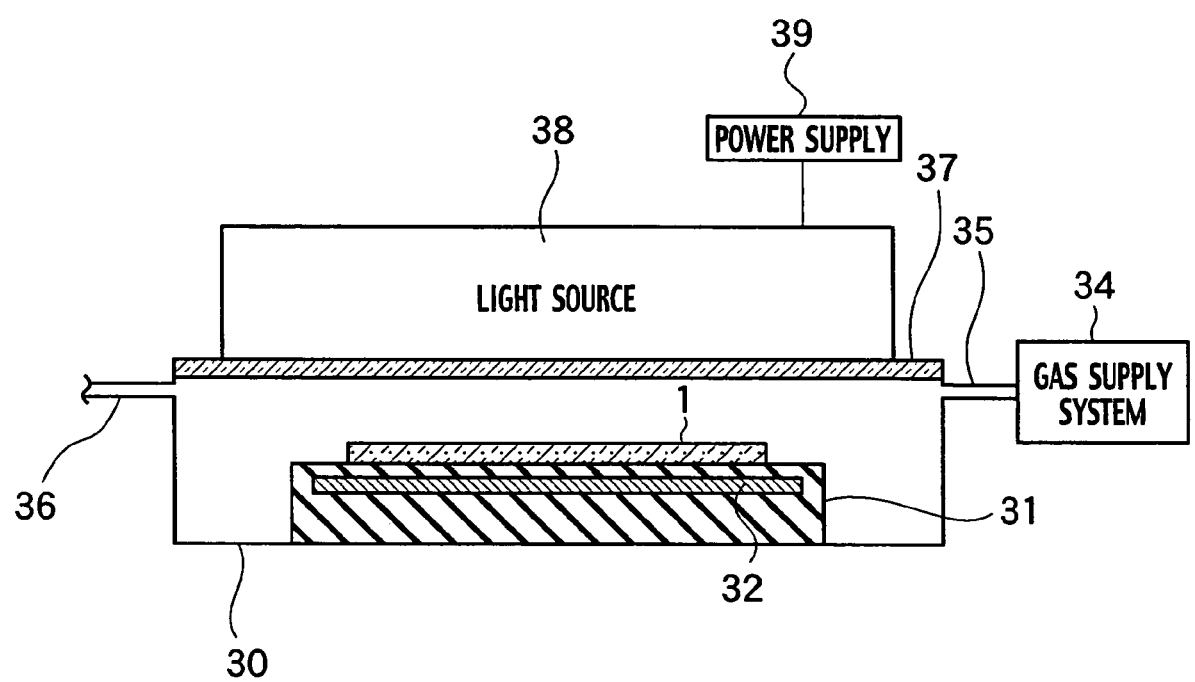
FIG. 1 is a schematic view showing an example of an annealing apparatus according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIRST EMBODIMENT

An annealing apparatus used in a manufacturing method of a semiconductor device according to a first embodiment of the present invention, includes a processing chamber 30, a susceptor 31, intake piping 35, and exhaust piping 36, a transparent window 37, and a light source 38. The processing chamber 30 executes annealing in order to activate impurities implanted into a semiconductor substrate 1, such as Si. The susceptor 31 is disposed on the inside of the processing chamber 30 and the semiconductor substrate 1 is placed thereon. The intake piping 35 feeds an ambient gas into the processing chamber 30, and the exhaust piping 36 vents the ambient gas from the processing chamber 30. The transparent window 37 is disposed in the top of the processing chamber 30 facing the susceptor 31. And the light source 38 irradiates the semiconductor substrate 1 with a pulse of light through the transparent window 37.

The processing chamber 30 is fabricated from a metal such as stainless steel, for example. The susceptor 31 is disposed in the bottom of the processing chamber 30 to place the semiconductor substrate 1 thereon. Materials such as aluminum nitride (AlN), ceramics or quartz are used for the susceptor 31. A heating source 32 for heating the semiconductor substrate 1 is incorporated in the susceptor 31. It is acceptable to use a structure having a surface made of a material such as aluminum nitride (AlN), ceramics or stainless steel protected by quartz, as the susceptor 31. Elements such as heating lamps or buried nichrome wire heating elements are acceptable for use as the heating source 32. Temperature of heating source 32 is controlled by a control system (not shown) provided outside of the processing chamber 30. A gas supply system 34 including a gas source that supplies an inert gas during the annealing of the semiconductor substrate 1 is connected to the intake piping 35.

The light source 38, being an element such as a flash lamp, irradiates and heats the surface of the semiconductor substrate 1 in a pulse, through the transparent window 37, which is a material such as synthetic quarts. The power supply 39, being an element such as a pulse power supply, drives the light source 40 at an extremely short pulse width of from approximately 0.1 ms to 100 ms. A power supply 39 controls the irradiation energy and pulse width of the light beamed from the light source 38. The energy density of the light source 38 is within a range of 5 J/cm$^2$ to 100 J/cm$^2$, and desirably within 20 J/cm$^2$ to 40 J/cm$^2$. The transparent window 38 serves the function of transmitting the light beamed from the light source 38 to the semiconductor substrate 1 while maintaining an airtight barrier separating the processing chamber 30 from the light source 38.

Figure 2:
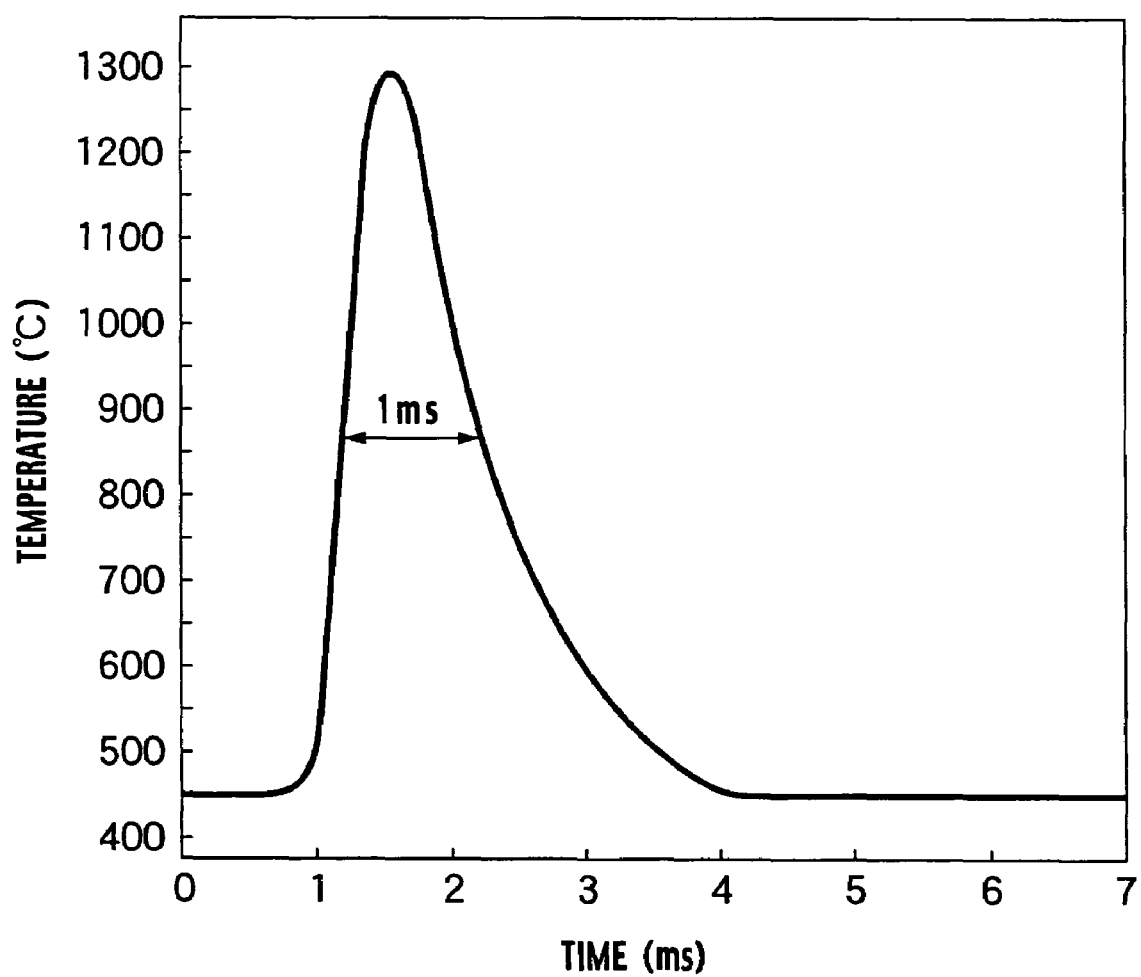
FIG. 2 is a diagram showing an example of the heating properties of a light source of an annealing apparatus according to the first embodiment of the present invention.

At 1300° C. for instance, which is highest temperature reached in the heating provided by the Xe flash lamp used on the light source 38, a thermal profile having a half width at approximately 1 ms can be attained, as shown in FIG. 2. In the Xe flash lamp, it is possible to achieve precipitous increases and decreases in temperature compared to an infrared lamp such as a halogen lamp used in RTA. For instance, the thermal elevation time for a temperature between 450° C. to 1300° C. is over 10 s, for example, approximately 15 s with halogen light. And a 2 s to 3 s thermal elevation time is required for temperature between the 900° C. and 1300° C. On the other hand, with flash lamp light, the time required reach temperatures (referred to as thermal elevation time hereinafter) in between 450° C. and 1300° C. is between 0.1 ms to 100 ms, and desirably between 0.5 ms to 50 ms. Further, the surface temperature of the semiconductor substrate 1 is measured by a high-speed pyrometer.

In the annealing process for activating impurities implanted by ion implantation, since the highest temperature reached at or below a thermal elevation time of 0.1 ms is at or below 900° C., the impurities implanted to the semiconductor substrate 1 may not be sufficiently activated. If the thermal elevation time exceeds 100 ms the highest temperature reached will exceed 1400° C. If the semiconductor substrate 1 is heated to above 1400° C., diffusion of the implanted impurities is noticeable. As a result, it becomes difficult to form a shallow pn junction near the surface of the semiconductor substrate 1 because of the diffusion of the impurities implanted to the semiconductor substrate 1.

In an activation annealing process, the semiconductor substrate 1 placed on top of the substrate stage 31 is pre-heated by the heating source 32 within a temperature range of 300° C. to 600° C., and desirably within 400° C. to 500° C., for example. Desirable pre-heating time would be in a range of 10 s to 120 s, for example. Pre-heating is set to a temperature and a time that will cause no damage on the semiconductor substrate 1. If the pre-heating temperature is below 300° C., there are cases in which the highest temperature reached will only be 900° C. or less. In addition, if the pre-heating temperature exceeds 600° C., there are cases in which the highest temperature reached will exceed 1400° C.

In the annealing apparatus according to the first embodiment, the thermal elevation time for the temperature range between 450° C. and 1300° C. is approximately 3 ms, as shown in FIG. 2. And the thermal elevation time for a temperature between 900° C. and 1300° C. is approximately 1 ms. According to the first embodiment, it is possible to execute activation annealing of impurities implanted to the semiconductor substrate 1 at a temperature of above 900° C. for example, in an extremely short period of time. Therefore, it is possible to form a shallow pn junction while suppressing the impurity diffusion length, caused by activation annealing, to less than five nm.

Next, a manufacturing method of a semiconductor device according to the first embodiment of the present invention will be described using a manufacturing process of a complimentary MOS (CMOS) transistor, which is a basic element of a semiconductor device, as an example. Further, the basic element of a semiconductor device described is not limited to a CMOS transistor. An element such as such as a p-MOS transistor or an n-MOS transistor, for instance are also acceptable. Additionally, a metal-insulator-semiconductor (MIS) transistor using an insulating film such as a silicon oxynitride (SiON) film, a silicon nitride ($Si_3N_4$) film, or a composite insulating film between a silicon oxide ($SiO_2$) film and an SiON film, an $Si_3N_4$ film, a various metal oxide film or the like, instead of an $SiO_2$ film of a MOS transistor, is also acceptable.

Figure 3:
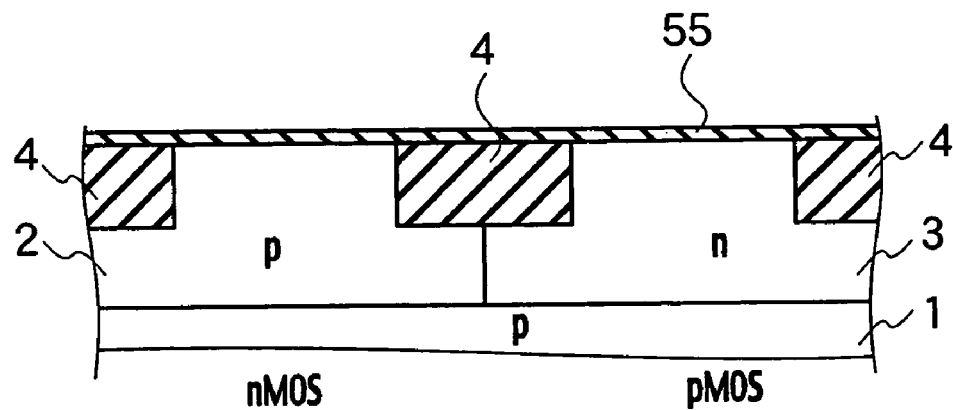
FIGS. 3 to 16 are cross sectional views showing an example of a manufacturing process of a semiconductor device using an impurity doping method according to the first embodiment of the present invention.

As shown in FIG. 3, a p-well 2 is formed in an n-MOS region of the p-type Si semiconductor substrate 1, and an n-well 3 is formed in a p-MOS region. Shallow trench isolations (STIs) 4 are formed to surround the p-well 2 and the n-well 3. The n-MOS and p-MOS regions which serve as element regions, are separated by the STIs 4. And an insulating film 55, made of a material such as thermally oxidized film for example, is formed on the surface of the semiconductor substrate 1.

Figure 4:
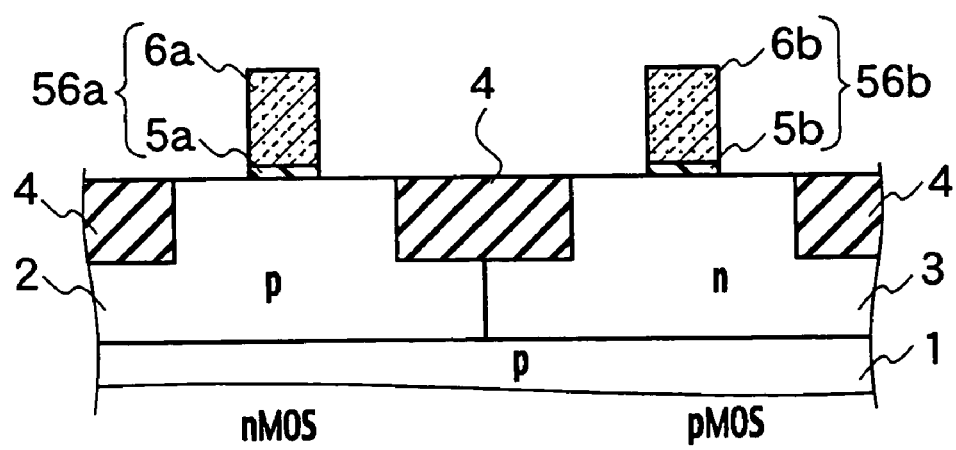

A poly-Si film is deposited on top of the insulating film 55 using a low-pressure chemical vapor deposition (LPCVD) method for example. And as shown in FIG. 4, the poly-Si film and the insulating film 55 are selectively removed away using photolithography and reactive ion etching (RIE), to form dummy patterns 56a, 56b on the surfaces of the n-MOS and p-MOS regions of the semiconductor substrate 1. The dummy patterns 56a, 56b have first dummy gates 5a, 5b, and second dummy gates 6a, 6b.

Figure 5:
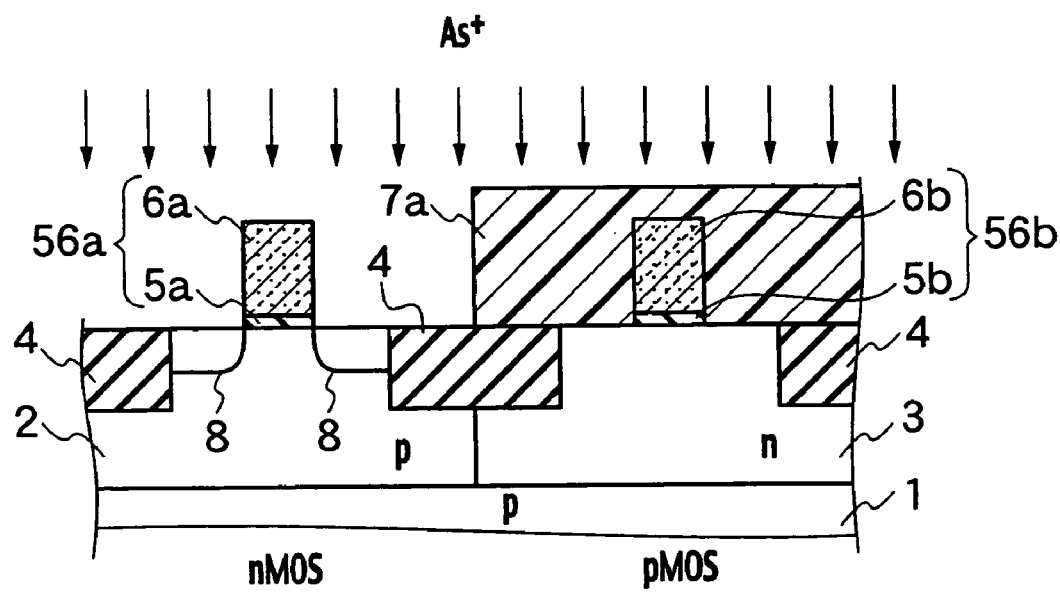

A resist film 7a is delineated in the p-MOS region of the semiconductor substrate 1 by photolithography. Ions of the group V element such as As, as n-type impurities are selectively implanted using the resist film 7a and the second dummy gate 6a of the n-MOS region as a mask. For instance, As ion implantation conditions are an acceleration energy of 1 keV and an implant dose of $1 \times 10^{15}$ $cm^{-2}$. By the As ion implantation, an impurity implanted layer 8 having a depth of approximately 15 nm from the surface of the p-well 2 is formed between both ends of the first dummy gate 5a and the STIs 4, as shown in FIG. 5. Thereinafter, the resist film 7a is removed.

Figure 6:
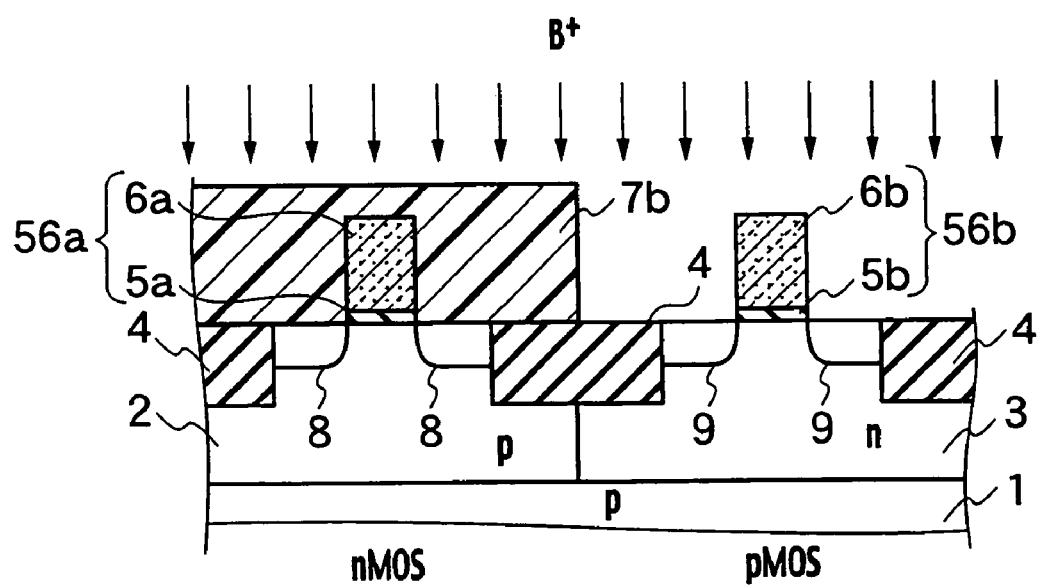

A resist film 7b is delineated in the n-MOS region of the semiconductor substrate 1 by photolithography. Ions of the group III element such as B, as p-type impurities are selectively implanted using the resist film 7b and the second dummy gate 6b of the n-MOS region as a mask. For instance, B ion implantation conditions are an acceleration energy of 200 eV and an implant dose of $1 \times 10^{15}$ $cm^{-2}$. By the B ion implantation, an impurity implanted layer 9 having a depth of approximately 15 nm from the surface of the n-well 3 is formed between both ends of the first dummy gate 5a and the STIs 4, as shown in FIG. 6. Thereinafter, the resist film 7b is removed.

Figure 7:
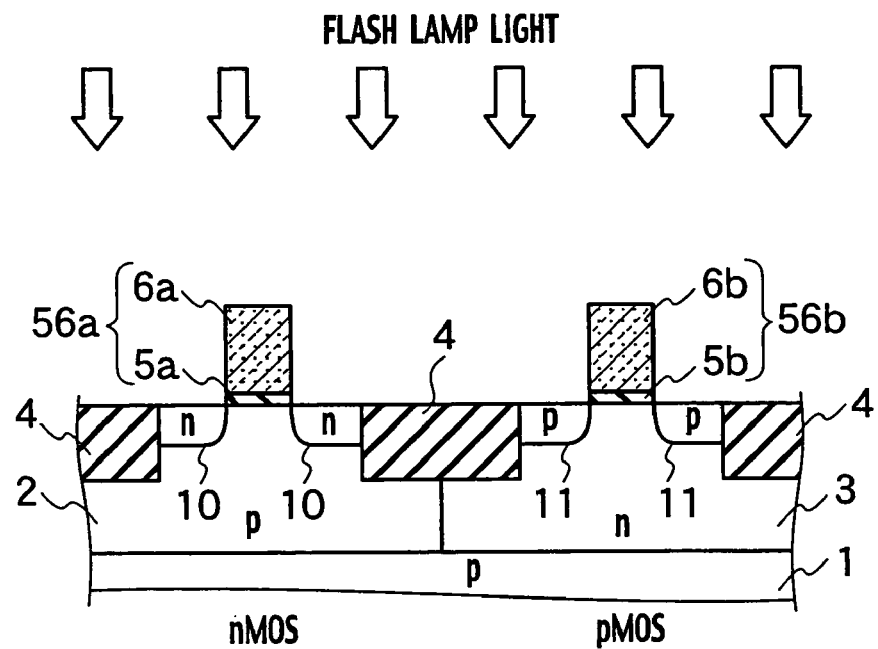

The semiconductor substrate 1 is placed on the susceptor 31 of the annealing apparatus shown in FIG. 1. The semiconductor substrate 1 is pre-heated from the bottom surface thereof to 450° C. for example, by the heating source 32 of the susceptor 31. While maintaining a pre-heating temperature of 450° C. on the semiconductor substrate 1, the surface of the semiconductor substrate 1 is irradiated with flash lamp light from the light source 38 under conditions of a pulse width of 1 ms and irradiation energy density of 30 $J/cm^2$. By activation annealing, B and As atoms are moved to reside substitutional lattice sites and activated during recrystallization of the damaged layers induced upon the impurity implanted layers 8 and 9 by ion implantation. As a result, an n-type extension region 10 and a p-type extension region 11 are formed between both ends of the first dummy gates 5a, 5b and the STIs 4, as shown in FIG. 7.

Figure 8:
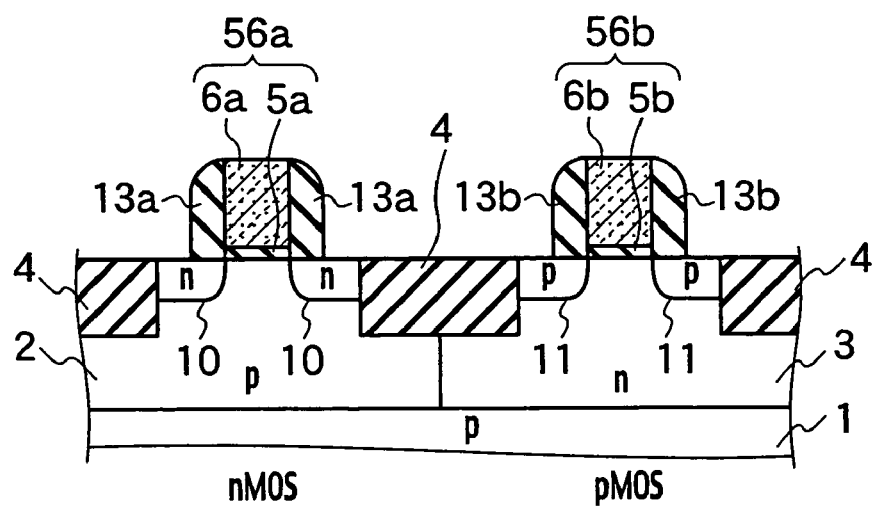

Insulating films made from $SiO_2$ and $Si_3N_4$ are sequentially deposited on top of the semiconductor substrate 1 by LPCVD. The insulating films of $SiO_2$ and $Si_3N_4$ are then selectively removed by directional etching such as RIE. As a result, the insulating films are selectively left on sides of the second dummy gates 6a, 6b and the first dummy gates 5a, 5b, to form sidewall spacers 13a and 13b, which are multi-layered structures of the $SiO_2$ film and the $Si_3N_4$ film, as shown in FIG. 8.

Figure 9:
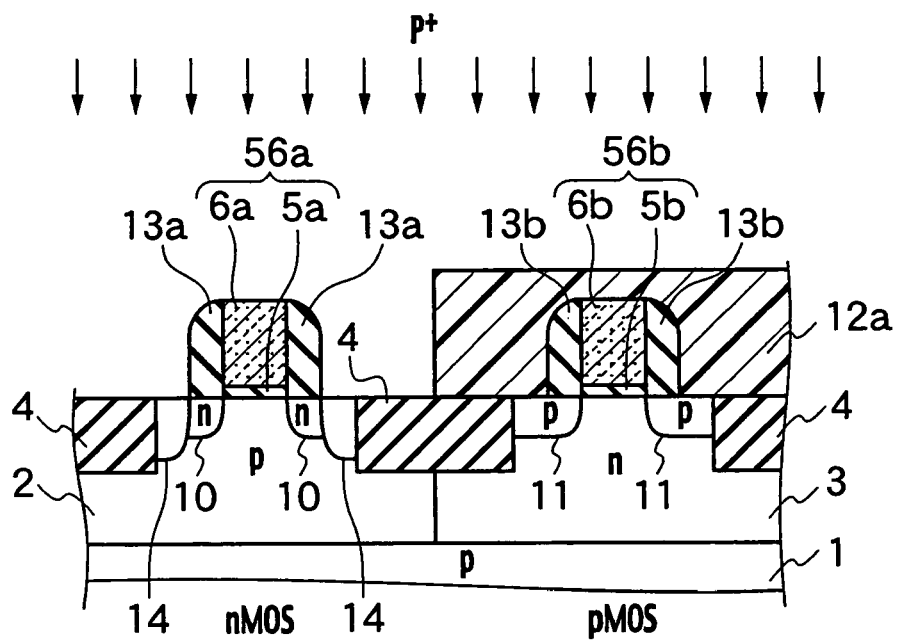
Figure 10:
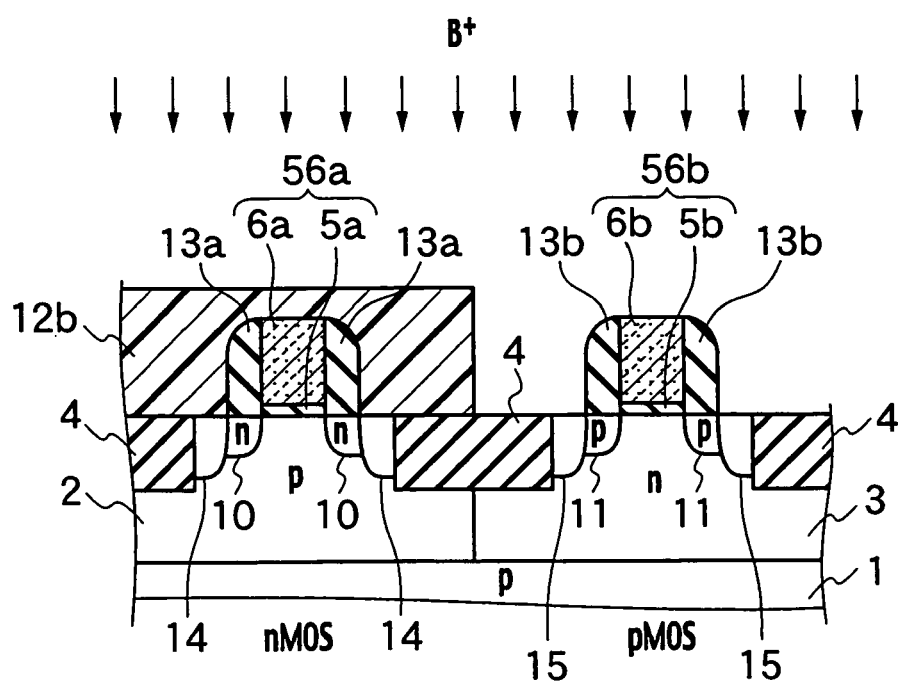

A resist film 12a is delineated on the p-MOS region by photolithography. Ions of the group V element such as P, as n-type source-drain impurities are selectively implanted into the n-MOS region using the second dummy gate 6a and the sidewall spacer 13a as a mask. Ion implantation conditions are an acceleration energy of 15 keV and an implant dose of $3\times10^{15}$ cm$^{-2}$. As a result, an impurity implanted layer 14, implanted with P ions, is formed between both ends of the sidewall spacer 13a and the STIs 4, as shown in FIG. 9. The impurity implanted layer 14 is formed at a depth of approximately 100 nm, which is deeper than the depth of the extension region 10. In the same manner, a resist film 12b is delineated on the n-MOS region by photolithography. Ions of the group III such as B, as p-type source-drain impurities are selectively implanted into the p-MOS region using the second dummy gate 6b and the sidewall spacer 13b as a mask. Ion implantation conditions are an acceleration energy of 4 keV and an implant dose of $3\times10^{15}$ cm$^{-2}$. As a result, an impurity implanted layer 15, implanted with B ions, is formed between both ends of the sidewall spacer 13b and the STIs 4, as shown in FIG. 10. The impurity implanted layer 15 is formed at a depth of approximately 100 nm, which is deeper than the depth of the extension region 11.

Figure 11:
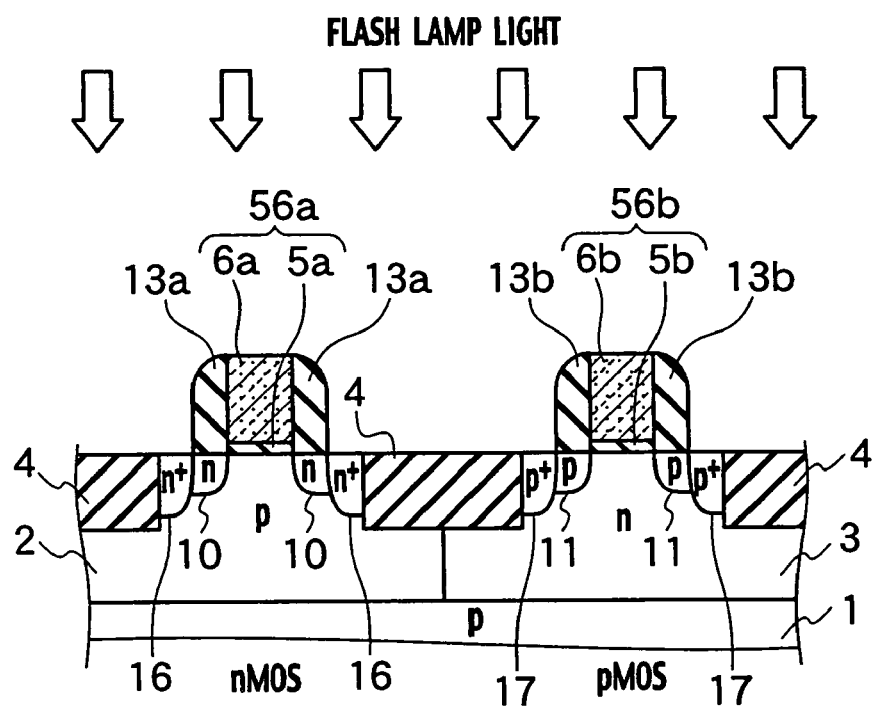

The semiconductor substrate 1 is placed on the susceptor 31 of the annealing apparatus shown in FIG. 1. The semiconductor substrate 1 is pre-heated from the bottom surface thereof to 450° C. for example, by the heating source 32 of the susceptor 31. While maintaining a pre-heating temperature of 450° C. on the semiconductor substrate 1, the top surface of the semiconductor substrate 1 is irradiated with flash lamp light from the light source 38 under conditions of a pulse width of 1 ms and irradiation energy density of 30 J/cm$^2$. As a result, an n$^+$ type source-drain region 16 is formed between both ends of the sidewall spacer 13a and the STIs 4 to contact the extension region 10, as shown in FIG. 11. Additionally, a p$^+$ type source-drain region 17 is formed between both ends of the sidewall spacer 13b and the STIs 4 to contact the extension region 11.

Figure 12:
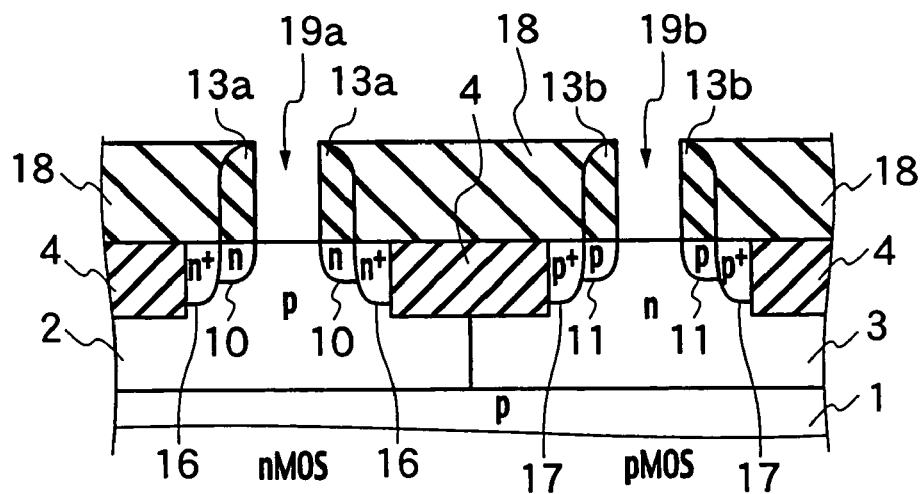

An interlevel insulating film such as SiO$_2$ is deposited over the entire surface of the semiconductor substrate 1. Thereinafter, by chemical mechanical polishing (CMP), the interlevel insulating film is removed until the upper surfaces of the second dummy gates 6a and 6b are exposed, so that the interlevel insulating film 18 is planarized, as shown in FIG. 12. Thereinafter, the exposed second dummy gates 6a, 6b are selectively removed by chemical dry etching (CDE), and the like. Further, the exposed first dummy gates 5a, 5b are removed by a hydrofluoric acid based etching process, to form openings 19a and 19b.

Figure 13:
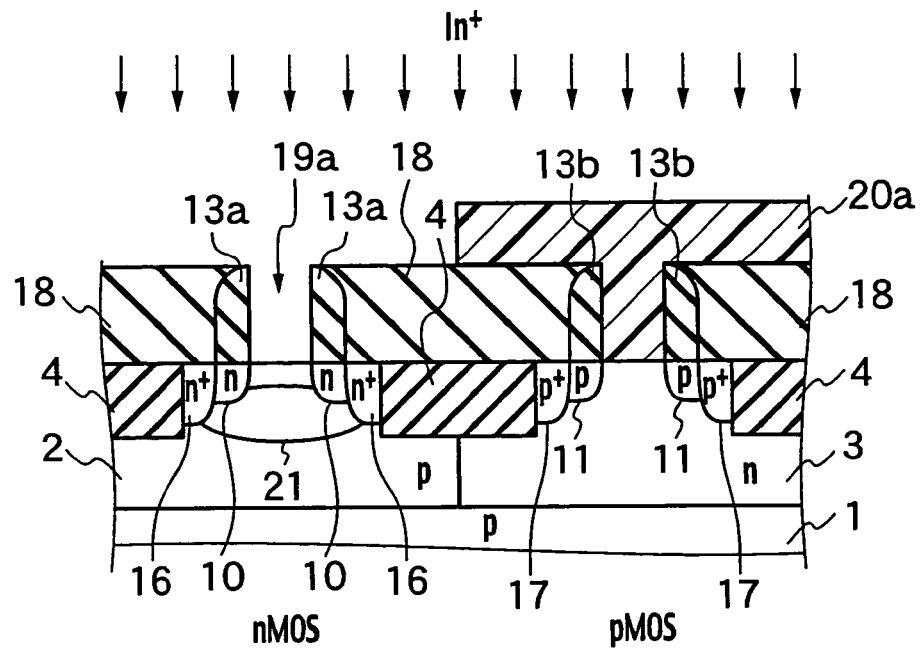

The p-MOS region is covered by a resist film 20a. Using the resist film 20a, the interlevel insulating film 18 and the sidewall spacer 13a as a mask, ions such as In with an impurity concentration higher than the concentration of the p-well 2, are selectively implanted into the opening 19a of the n-MOS region. Ion implantation conditions are an acceleration energy of 150 keV and an implant dose of $1\times10^{13}$ cm$^{-2}$. By ion implantation, an impurity implanted layer 21 is formed directly below the opening 19a to contact the extension region 10 and the source-drain region 16 as shown in FIG. 13. The impurity implanted layer 21 is formed at a depth of approximately 10 nm to 120 nm, for example. Thereinafter, the resist film 20a is removed.

Figure 14:
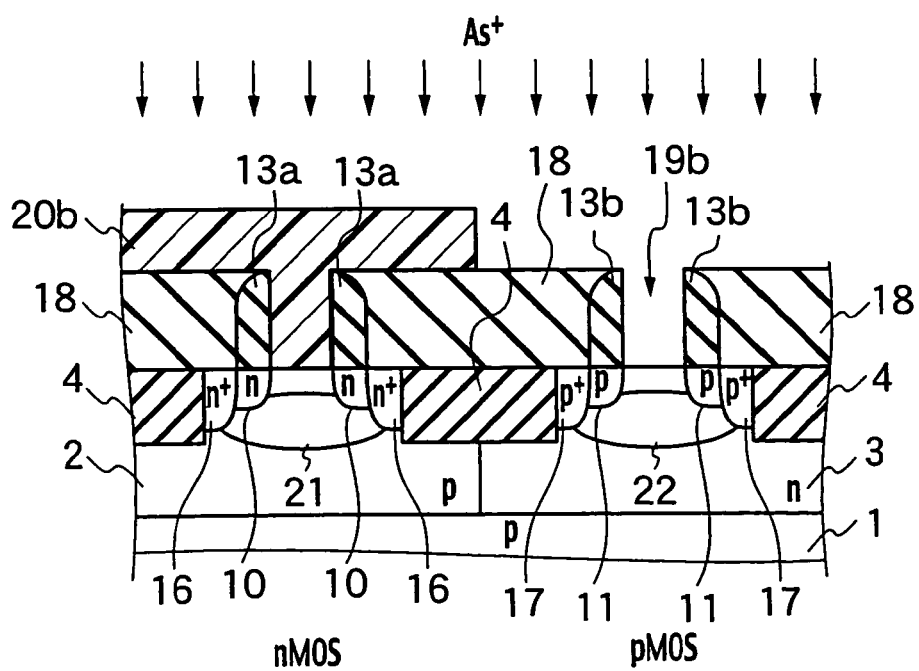

The n-MOS region is covered by a resist film 20b. Using the resist film 20b, the interlevel insulating film 18 and the sidewall spacer 13b as a mask, ions such as As with an impurity concentration higher than the concentration of the n-well 3, are selectively implanted into the opening 19b of the p-MOS region. Ion implantation conditions are an acceleration energy of 100 keV and an implant dose of $1\times10^{13}$ cm$^{-2}$. By ion implantation, an impurity implanted layer 22 is formed directly below the opening 19b to contact the extension region 11 and the source-drain region 17 as shown in FIG. 14. The impurity implanted layer 22 is formed at a depth of approximately 10 nm to 120 nm, for example. Thereinafter, the resist film 20b is removed.

Figure 15:
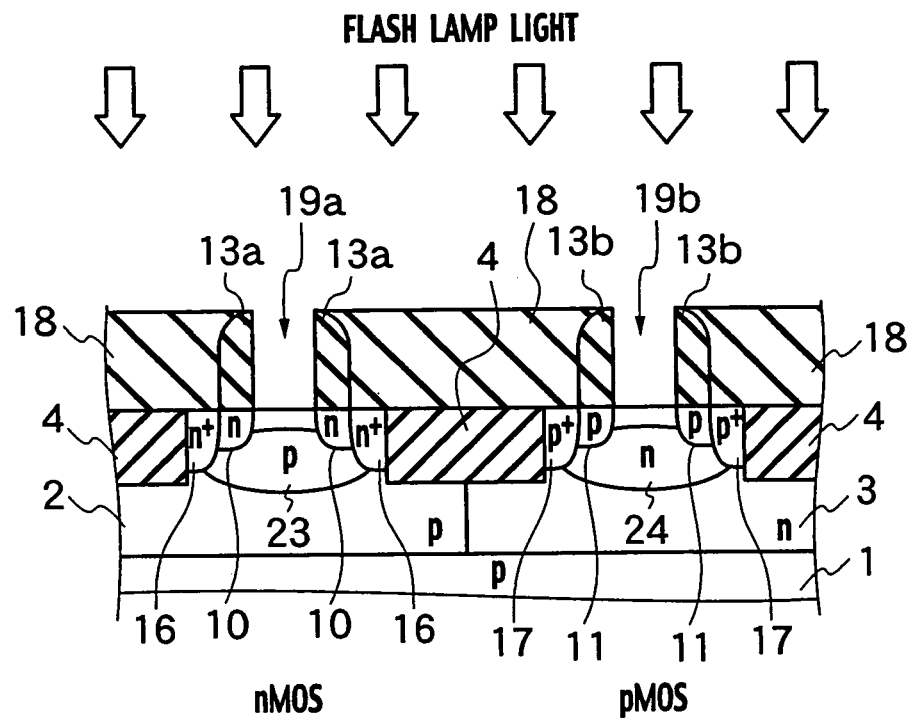

The semiconductor substrate 1 is placed on the susceptor 31 of the annealing apparatus shown in FIG. 1. The semiconductor substrate 1 is pre-heated from the bottom surface thereof to 450° C. for example, by the heating source 32 of the susceptor 31. While maintaining a pre-heating temperature of 450° C. on the semiconductor substrate 1, the top surface of the semiconductor substrate 1 is irradiated with flash lamp light from the light source 38 under conditions of a pulse width of 1 ms and irradiation energy density of 30 J/cm$^2$. As a result, a p-type channel region 23 is formed under the opening 19a to contact the extension region 10 and the source-drain region 16, as shown in FIG. 15. An n-type channel region 24 is formed under the opening 19b to contact the extension region 11 and the source-drain region 17.

Figure 16:
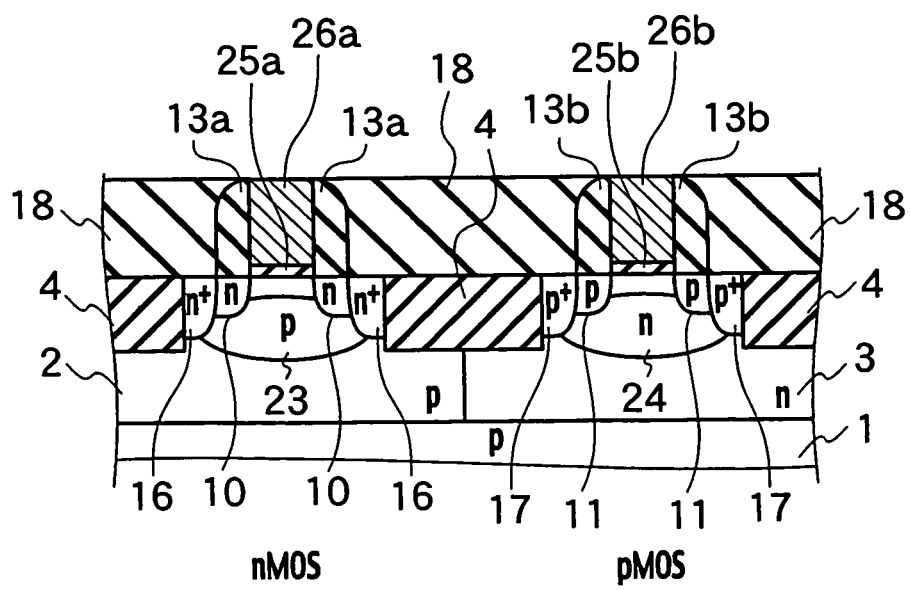

A high dielectric constant (high-k) film such as nitrided hafnium silicate (HfSiON) and a refractory metal film such as tungsten (W) are sequentially deposited on top of the surface of the semiconductor substrate 1. Thereinafter, the unneeded high-k film and the refractory metal film on top of the interlevel insulating film 18 are removed by CMP, and gate insulating films 25a, 25b and gate electrodes 26a, 26b are formed, as shown in FIG. 16. Further, before the refractory metal film is deposited, it is desirable to deposit a titanium nitride (TiN) film for example, as a reaction prevention film on top of the high-k film, by CVD.

Thereinafter, another interlevel insulating film of SiO$_2$ is deposited on the surface of the semiconductor substrate 1. Contact holes are opened in the another interlayer insulation layer above the gate electrodes 26a, 26b, the n$^+$-type source-drain region 16, and the p$^+$-type source-drain region 17. Wiring is connected to the gate electrodes 26a, 26b, the n$^+$-type source-drain region 16 and the p$^+$-type source-drain region 17 through the contact holes. Thus, a semiconductor device is fabricated.

In the first embodiment, the gate electrodes 26a, 26b, which are composed of W for example, are used. Thus, it is possible to prevent gate depletion that has been problematic for poly-Si gate electrodes. It also is possible to execute activation annealing of impurities implanted into the semiconductor substrate 1 at temperatures above 900° C. in an extremely short period of time. Therefore, it is possible to suppress an impurity diffusion caused by activation annealing, and to form a shallow pn junction.

Additionally, compared to impurities such as B, P, and As, In has a larger atomic mass. Therefore, it is possible to sharpen the profile of the In concentration of ion implantation. When the diffusion occurring in the annealing process can be suppressed, and high concentration activation is possible, it is possible to use in the channel doping in order to suppress the short channel effect in MOS transistors and the like. Therefore, In may be suitable for use in the miniaturization of a semiconductor device.

Figure 17:
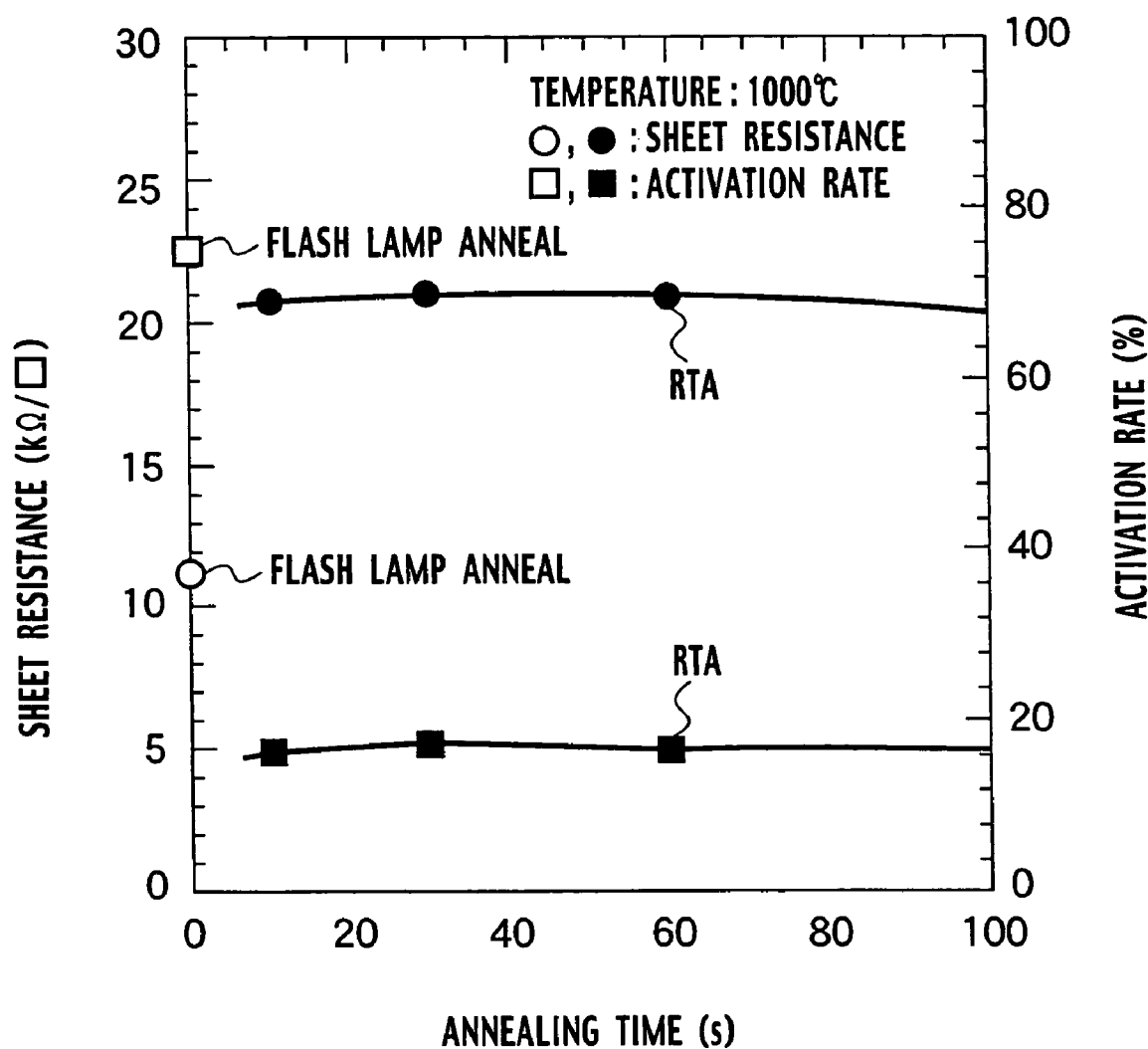
FIG. 17 is a diagram showing an example of the dependency of sheet resistance of an impurity implanted layer and an activation rate on annealing time.
Figure 18:
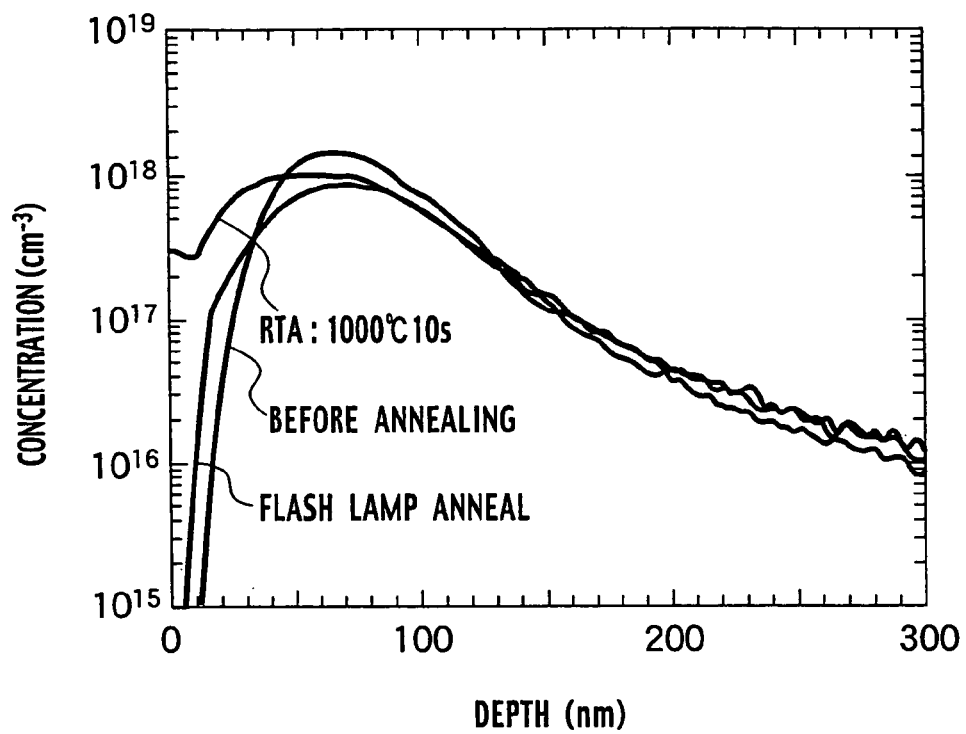
FIG. 18 is a diagram showing an example of the impurity distribution of In after annealing.

In RTA using a halogen lamp, the activation rate of implanted In is at or below 20%, and the sheet resistance of an In implanted layer is as high as 20 kΩ/☐ or above, as shown in FIG. 17. In flash lamp annealing, the activation rate of In is approximately 80%, achieving a higher activation rate than RTA. Sheet resistance also falls to approximately 12 kΩ/☐ corresponding to the higher activation rate. Additionally, in RTA, In diffuses through to the surface of the indium implanted layer, which makes it impossible to maintain a sharp concentration profile before annealing, as shown in FIG. 18. On the other hand, in flash lamp annealing, diffusion of In towards the surface of the indium implanted layer is suppressed to within five nm. Thus, with the manufacturing method according to the first embodiment, it is possible to sufficiently activate indium and attain a sharp concentration profile.

Figure 19:
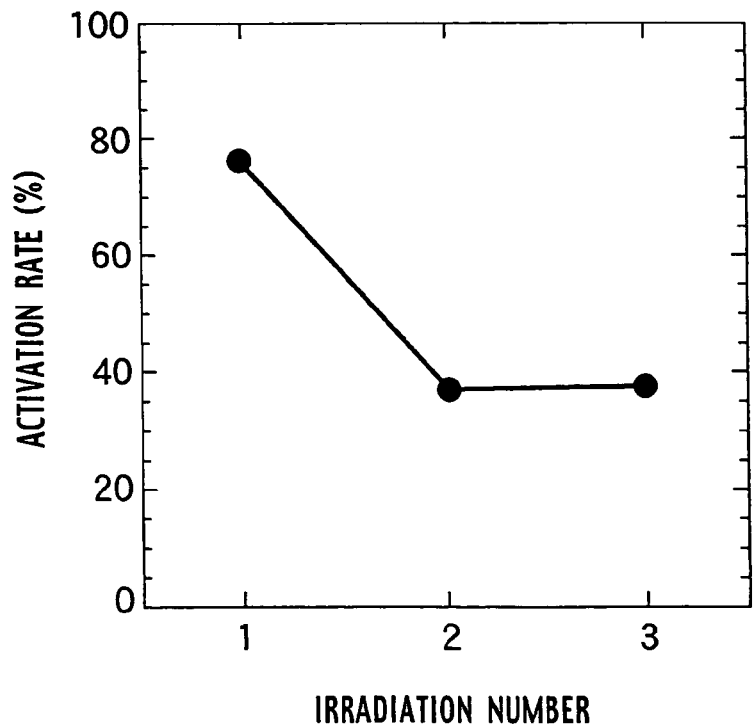
FIG. 19 is a diagram showing an example of the dependency of an activation rate of In on the number of the flash lamp irradiation times.

Additionally, when activation of an In implanted layer is executed over the course of several irradiations of a flash lamp, the activation rate of In falls from approximately 80% to approximately 40%, as shown in FIG. 19. In the first embodiment after the formation of extension and source-drain regions, the second dummy gates are removed and indium is implanted therein. The activation annealing of In is the last high temperature process in the manufacture of a semiconductor device, and the In implanted layer receives light from the flash lamp only once. After the activation annealing of In, there are no processes having temperatures above 500° C. Therefore, according to the first embodiment, it is possible to prevent a drop in the activation rate of In. Additionally, it is possible to form a channel region having an impurity distribution that rises sharply from a location several nm from the top-most layer of the semiconductor substrate 1. Therefore, it is possible to suppress short channel effect to improve the properties of a transistor.

Additionally, as described in the first embodiment, the last high temperature process on a semiconductor manufacturing method, as the process of activating impurities by flash lamp annealing is not only effective in activating In. For example, after forming the extension regions 10 and 11, using a process such as LPCVD, $Si_3N_4$ film is deposited as the sidewall spacers 13a and 13b of the second dummy gates 6a and 6b. The deposition temperature of the $Si_3N_4$ film is a relatively low temperature of approximately 700° C., and at least 1 hour is required before a film with a desired thickness is deposited. Because the deposition time is long, a decrease of the activation rate of the once activated impurities of the extension regions 10 and 11 will occur in correspondence to the solid-solubility limit of impurities at the deposition temperature. For example, the activation rate of the As and B atoms implanted into the extension region 10 and 11 decrease to 20% and below after the deposition of the $Si_3N_4$ film. However, differing from In, it is affirmed that the activation rate of the impurities such as As and B recovers at an annealing temperature of above 900° C. In the first embodiment, in the last high temperature process in the manufacture of a semiconductor device, activation annealing according to flash lamp annealing is executed. Therefore, in the manufacturing method of a semiconductor device according to the first embodiment, effectiveness is maintained even for suppressing a decrease in the activation rate of impurities implanted in the extension regions 10 and 11, and the like.

Further, in the first embodiment, flash lamp annealing is used for the activation annealing of the extension regions 10, 11, and the source-drain regions 16, 17. However, it is possible to activate the impurities implanted into the extension regions 10, 11, and the source-drain regions 16, 17 together with the activation annealing of the channel regions 23 and 24 shown in FIG. 15. For example, even by RTA, at an annealing temperature of below 900° C., although activation rate is low it is possible to suppress diffusion of implanted impurities to within 5 nm. Recrystallization of layers that have been damaged by ion implantation is also possible at temperatures above 500° C. Therefore, it is also acceptable to switch from flash lamp annealing to RTA within a temperature range of 500° C. to 900° C. for the annealing of the extension regions 10, 11, and the source-drain regions 16, 17, at immediately after ion implantation. Annealing time for RTA can be equal to the time required for the recrystallization of layers damaged by ion implantation, for example, above ten s.

Figure 20:
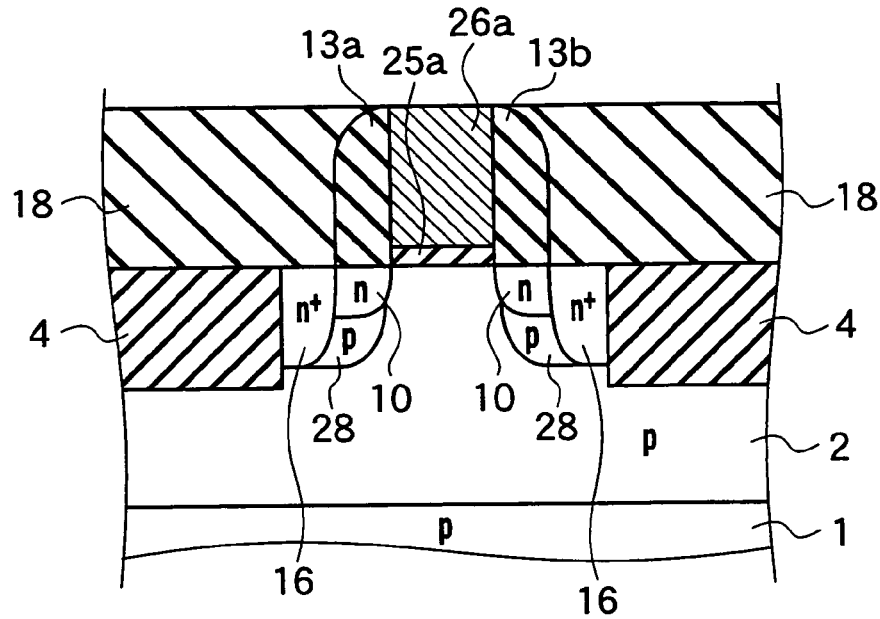
FIG. 20 is a cross sectional view showing another example of a semiconductor device by an impurity doping method according to the first embodiment of the present invention.

In the first embodiment, channel doping, which suppresses the short channel effect, is provided in the channel regions 23 and 24 under the gate insulating films 25a and 25b. However, as shown in FIG. 20, it is also acceptable to distribute In in a hollow region 28, which contacts the extension region 10 and the source-drain region 16, instead of distributing In in a channel region. It is acceptable to execute formation of the hollow region 28, which belongs to the p-well 2, by a tilt angle ion implantation after the activation annealing of the impurity implanted layer 14, 15 shown in FIG. 10, for example.

SECOND EMBODIMENT

Figure 21:
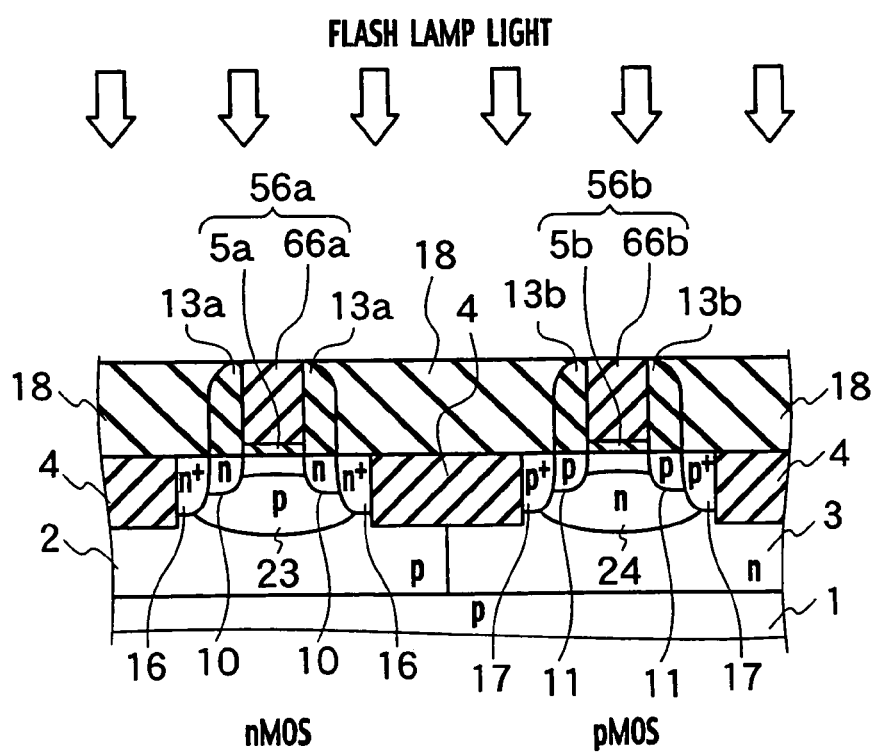
FIG. 21 is a cross sectional view showing an example of a semiconductor device by an impurity doping method according to the second embodiment of the present invention.

In an impurity doping method used in a manufacturing method of a semiconductor device according to a second embodiment of the present invention, an insulating film such as $Si_3N_4$ is used for second dummy gates 66a and 66b, as shown in FIG. 21. Impurities of In and As implanted into the channel regions 23 and 24 below dummy patterns 56a and 56b are activated through the dummy patterns 56a, 56b by light from the flash lamp. And simultaneously, impurities implanted into the extension regions 10, 11, and the source-drain regions 16, 17 are activated through the sidewall spacers 13a and 13b, and the interlevel insulating film 18 by the light from the flash lamp. In the second embodiment, the aspect in which the light from the flash lamp irradiates through the dummy patterns 56a, 56b, the sidewall spacers 13a and 13b, and the interlevel insulating film 18, is different from the first embodiment. Other aspects of the second embodiment are identical to the first embodiment. Thus, redundant description will be omitted thereof.

Figure 22:
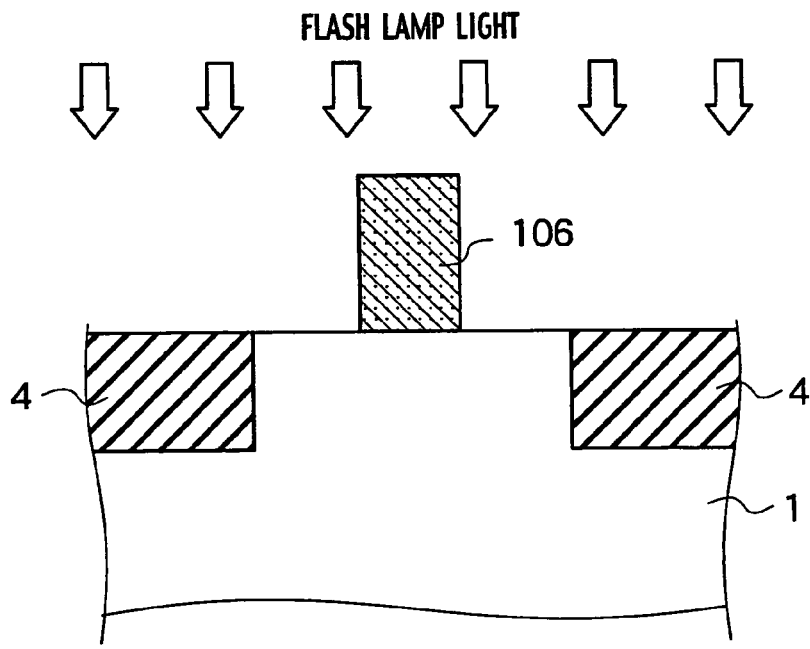
FIG. 22 is a cross sectional view showing an example of a semiconductor device according to a comparison example.

A case in which light from a flash lamp heats a Si semiconductor substrate 1 having a poly-Si gate electrode 106 provided thereon, as shown in FIG. 22, will be described as a comparative example. The gate electrode 106 is provided in an element region, which is sandwiched by STIs 4. For the sake of simplicity of description, mention of a gate insulating film, ion implanted layers such as an extension region, and sidewall spacers has been omitted. The refraction index n of the materials used in the formation of a semiconductor device is distributed chiefly within the range of 1.4 to 5.0. For instance, the refraction index n of Si crystal of the semiconductor substrate 1 is approximately 4.1. The refraction index n of the poly-Si film of the gate electrode 106 is 3.8 to 4.6. The refraction index n of the $SiO_2$ film used for the STI 4, gate insulating film, sidewall spacers, and interlevel insulating film is approximately 1.5. The refraction index n of the $Si_3N_4$ film used for the interlevel insulating film, sidewall spacers and the like is approximately 2.0.

The peak wavelength of the light of the flash lamp ranges with visible light, and has a continuous spectrum ranging from visible to infrared light. The silicon crystal of the semiconductor substrate 1 has an absorption spectrum that is caused by the band structure. Visible light is absorbed in silicon crystal. The visible light components of the flash lamp are propagated to the interior of the semiconductor substrate 1 during an absorption process.

Figure 23:
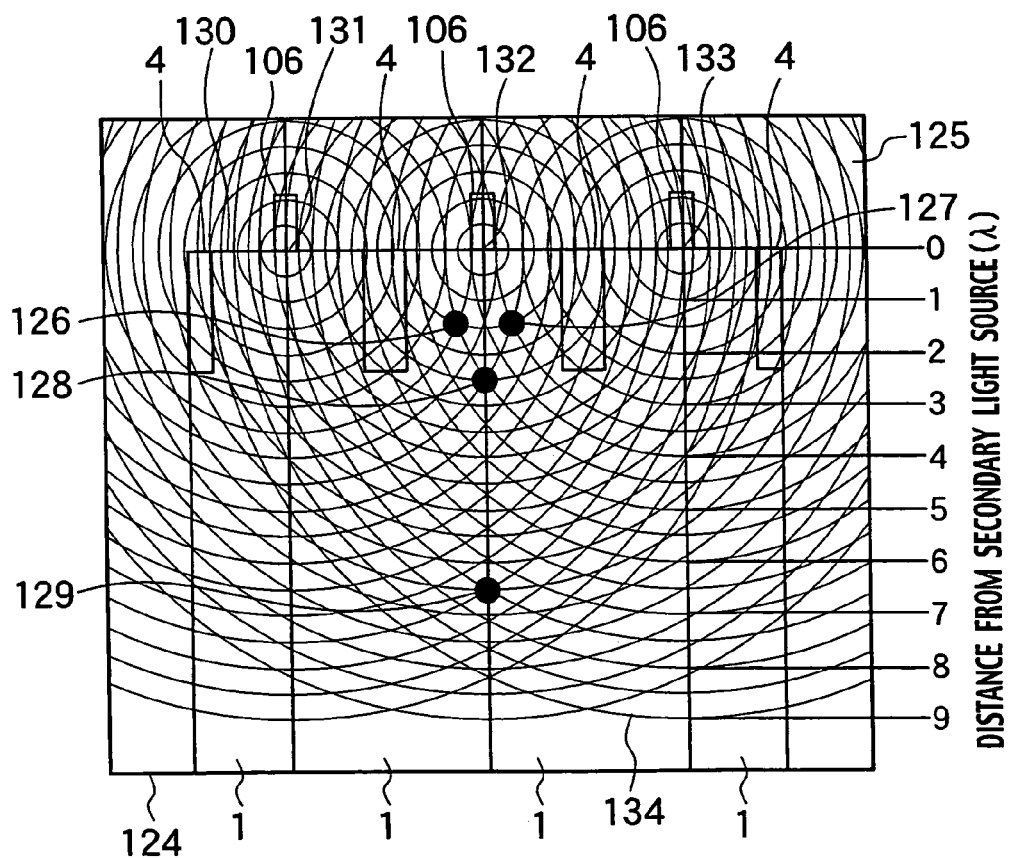
FIG. 23 is a cross sectional view showing a semiconductor device exhibiting an occurrence of a hot spot of a flash lamp light, according to a comparative example.

For example, as shown in FIG. 23, in a pattern that is periodically disposed similar to a plurality of gate electrodes 106 surrounded by atmosphere, a reflection ratio of incident light is small. Also, the visible light components of the flash lamp from the atmosphere incident upon a surface 130 of the semiconductor substrate 1 and side faces of the plurality of gate electrodes 106 are greatly refracted and propagated, because of a large difference of 3 of the refraction indexes n of the atmosphere and the semiconductor substrate 1, or the gate electrodes 106. The refracted visible light interferes with the propagated visible light of the same wavelength λ that is incident upon the plurality of gate electrodes 106 at the border between the plurality of gate electrodes 106 and the semiconductor substrate 1. The interfering identical light of the same wavelength λ at the border of the plurality of gate electrodes 106 and the semiconductor substrate 1 is easily synchronized. The surface 130 of the semiconductor substrate 1, which is under the gate electrodes 106, serves as secondary light sources 131 through 133. And synchronized visible light components are propagated to the interior of the semiconductor substrate 1.

For instance, at hotspots 126 to 129, three propagating waves of synchronized identical wavelength irradiated from secondary light sources 131 to 133 will coincide in phase and may interfere with each other. At the hotspots 126 to 129 overlapping the three propagating waves reach the highest amplitude, that is, the highest light energy. As a result, the hotspots 126 to 129 locally generate heat to lead occurrence for slips or cracks. The hotspots 126, 127 are separated from the secondary light source 132 by 1.5*λ, the hotspot 128 is separated from the secondary light source 132 by 2.5*λ, and the hotspot 129 is separated from the secondary light source 132 by 6.5*λ. In particular, the depth of the hotspots 126, 127 from the surface 130 of the semiconductor substrate 1 is approximately 675 nm, when the wavelength λ of the secondary light source 132 is the peak wavelength of 450 nm.

On the other hand, in the second embodiment, after forming the interlevel insulating film 18 in such a way that the convex patterns of the dummy patterns 56a, 56b and the sidewall spacer 13a are planarized, the flash lamp light is irradiated. The flash lamp light is irradiated from the atmosphere, through the dummy patterns 56a, 56b, the sidewall spacers 13a, 13b, and the interlevel insulating film 18, to the semiconductor substrate 1. The refractive index n of the $Si_3N_4$ film of the second dummy patterns 66a, 66b of the dummy patterns 56a, 56b, is 2.0. The refraction index n of the $SiO_2$ film of the interlevel insulating film 18 is approximately 1.5. The difference in the refraction indexes n of the dummy patterns 56a, 56b and the interlevel insulating film 18 is approximately 0.5. Because the difference in the refraction indexes n is small, the generation of secondary light sources is suppressed, and the interference of the flash lamp light is reduced. Thus, it is possible to suppress generation of hotspots, and reduce the intensity of local heat generation. In this manner, it is possible to improve on the thermal uniformity in the annealing of the semiconductor substrate 1, and reduce damages such as slips or cracks. Further, if the difference in the refraction indexes n of the dummy patterns 56a, 56b and the interlevel insulating film 18 is one or less, it is possible to suppress the generation of secondary light sources.

Next, a manufacturing process of a semiconductor device according to the second embodiment of the present invention will be described using a manufacturing process of a CMOS transistor which is one of the basic elements of a semiconductor device, as an example. Further, the basic element of a semiconductor device described is not limited to a CMOS transistor. An element such as such as a p-MOS transistor or an n-MOS transistor, for instance are also acceptable. Also, not only MOS transistors, but MIS transistors are also acceptable.

Figure 24:
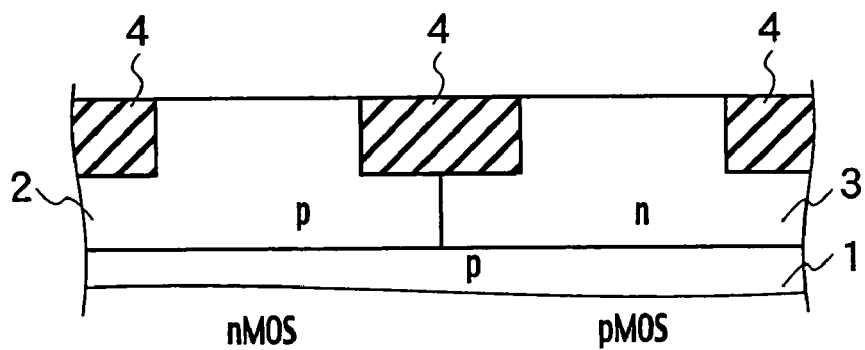
FIGS. 24 to 32 are cross sectional views showing an example of a manufacturing process of a semiconductor device using an impurity doping method according to the second embodiment of the present invention.

As shown in FIG. 24, a p-well 2 is formed within an n-MOS region of a p-type Si semiconductor substrate 1, and an n-well 3 is formed within a p-MOS region of the semiconductor substrate 1. STIs 4 are formed to surround the p-well 2 and the n-well 3. The n-MOS and p-MOS regions which serve as element regions, are separated by the STIs 4.

Figure 25:
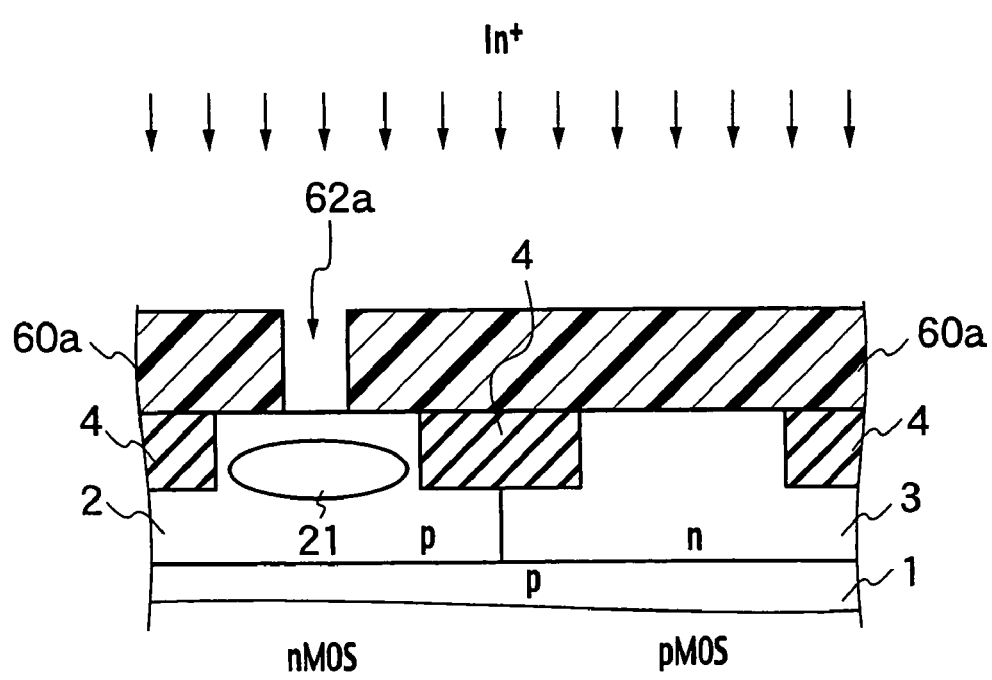

By photolithography, an opening 62a is formed in a resist film 60a, as shown in FIG. 25. A p-type impurity having a higher concentration than the p-well 2, such as In, is selectively ion implanted into the opening 62a. Conditions of ion implantation are an acceleration energy of 150 keV and an implant dose of $1\times10^{13}$ cm$^{-2}$, for example. By ion implantation, the impurity implanted layer 21 is formed under the opening 62a at a depth of approximately 10 nm to 120 nm for instance. Thereinafter, the resist film 60a is removed.

Figure 26:
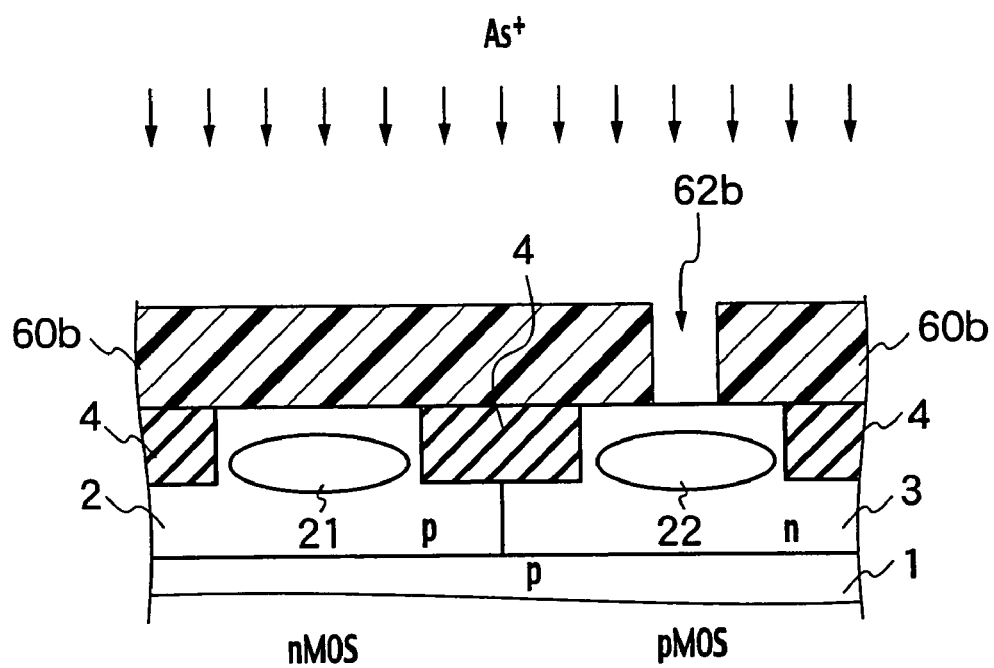
Figure 27:
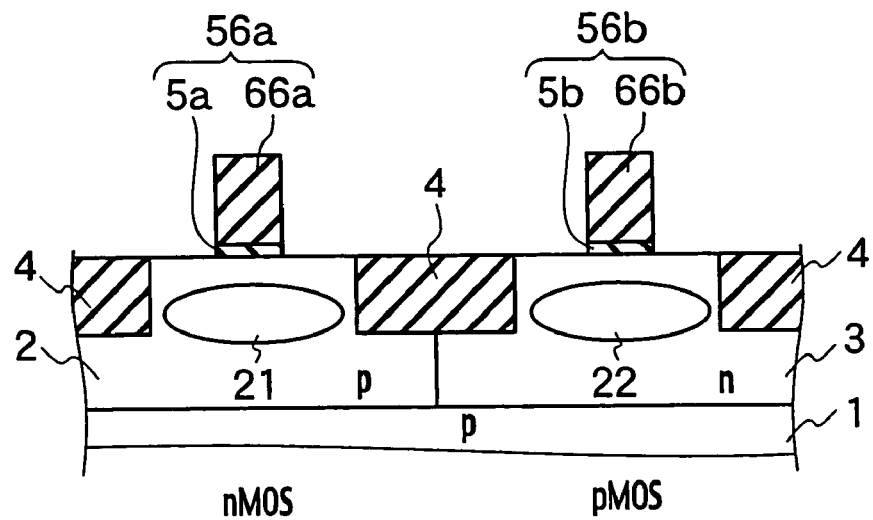

By photolithography, an opening 62b is formed in a resist film 60b, as shown in FIG. 26. An n-type impurity having a higher concentration than the n-well 3, such as As, is selectively ion implanted into the opening 62b. Conditions of ion implantation are an acceleration energy of 100 keV and an implant dose of $1\times10^{13}$ cm$^{-2}$, for example. By ion implantation, the impurity implanted layer 22 is formed under the opening 62b at a depth of approximately 10 nm to 120 nm for instance. Thereinafter, the resist film 60b is removed.

At a temperature of 700° C., for example, an $Si_3N_4$ film is deposited on top of the insulating film formed after thermally oxidizing the surface of the semiconductor substrate 1, by LPCVD. By photolithography and RIE, the $Si_3N_4$ film and the insulating film are selectively removed, to form the dummy patterns 56a, 56b, above the impurity implanted regions 21, 22, respectively. The dummy patterns 56a, 56b have first dummy gates 5a, 5b and second dummy gates 66a, 66b, respectively.

Figure 28:
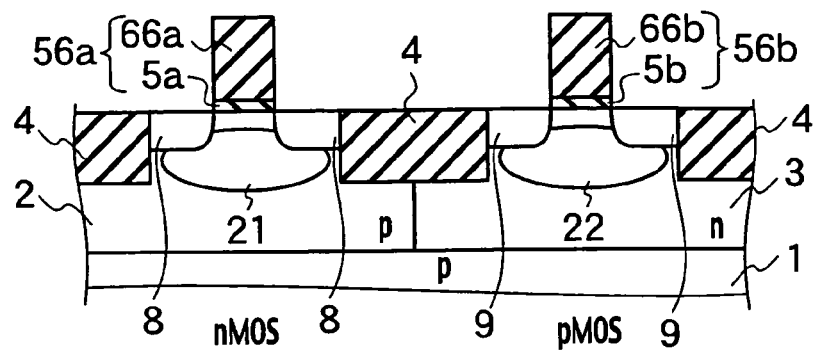

The p-MOS region of the semiconductor substrate 1 is coated with a resist film by photolithography. Ions of the group V element such as As, as n-type impurities are selectively implanted using the dummy pattern 56a as a mask. For instance, As ion implantation conditions are an acceleration energy of 1 keV and an implant dose of $1\times10^{15}$ cm$^{-2}$. By the As ion implantation, impurity implanted layers 8 having a depth of approximately 15 nm from the surface of the p-well 2 is formed between both ends of the first dummy gate 5a and the STIs 4, as shown in FIG. 28.

The n-MOS region of the semiconductor substrate 1 is coated with a resist film by photolithography. Ions of the group III element such as B, as p-type impurities are selectively implanted using the dummy pattern 56b as a mask. For instance, B ion implantation conditions are an acceleration energy of 200 keV and an implant dose of $1\times10^{15}$ cm$^{-2}$. By the B ion implantation, an impurity implanted layer 9 having a depth of approximately 15 nm from the surface of the n-well 3 is formed between both ends of the first dummy gate 5b and the STIs 4, as shown in FIG. 28.

By LPCVD, insulating films of $SiO_2$ and $Si_3N_4$ are sequentially deposited on top of the semiconductor substrate 1 at a temperature of 700° C. Sidewall spacers 13a and 13b are selectively formed on the sidewalls of the dummy patterns 56a, 56b by directional etching such as RIE.

Figure 29:
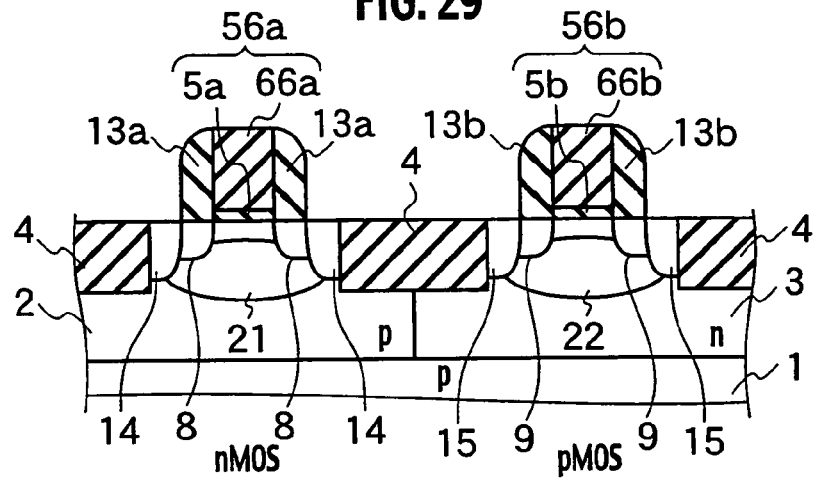

The p-MOS region is coated with a resist film by photolithography. Ions of the group V element such as P, as n-type source-drain impurities are selectively implanted using dummy pattern 56a and the sidewall spacer 13a as a mask. Ion implantation conditions are an acceleration energy of 15 keV and an implant dose of $3\times10^{15}$ cm$^{-2}$. As a result, an impurity implanted layer 14, implanted with P ions, is formed between both ends of the sidewall spacer 13a and the STIs 4, as shown in FIG. 29. The impurity implanted layer 14 is formed at a depth of approximately 100 nm, which is deeper than the depth of the impurity implanted layer 8.

The n-MOS region is coated with a resist film by photolithography. Ions of the group III such as B, as p-type source-drain impurities are selectively implanted using dummy pattern 56b and the sidewall spacer 13b as a mask. Ion implantation conditions are an acceleration energy of 4 keV and an implant dose of $3\times10^{15}$ cm$^{-2}$. As a result, an impurity implanted layer 15, implanted with boron (B) ions, is formed between both ends of the sidewall spacer 13b and the STIs 4, as shown in FIG. 29. The impurity implanted layer 15 is formed at a depth of approximately 100 nm, which is deeper than the depth of the impurity implanted layer 9.

Figure 30:
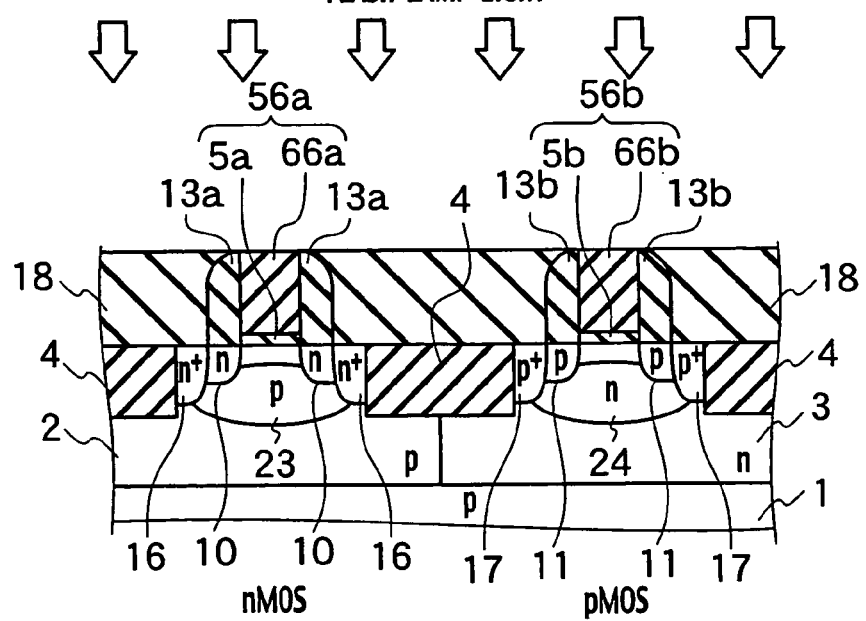

An interlevel insulating film of SiO$_2$ is deposited over the entire surface of the semiconductor substrate 1. Thereinafter, by CMP, the interlevel insulating film is removed until the upper surfaces of the second dummy gates 66a and 66b are exposed, so that an interlevel insulating film 18 is planarized with a level of a thickness of the dummy patterns 56a, 56b. The semiconductor substrate 1 is placed on the susceptor 31 of the annealing apparatus shown in FIG. 1. The semiconductor substrate 1 is pre-heated from the bottom surface thereof to 450° C. for example, by the heating source 32 of the susceptor 31. And while maintaining a pre-heating temperature of 450° C. on the semiconductor substrate 1, the top surface of the semiconductor substrate 1 is irradiated with flash lamp light from the light source 38 under conditions of a pulse width of 1 ms and irradiation energy density of 30 J/cm$^2$. As a result, channel regions 23, 24, extension regions 10, 11, and source-drain regions 16, 17 are formed, as shown in FIG. 30.

Figure 31:
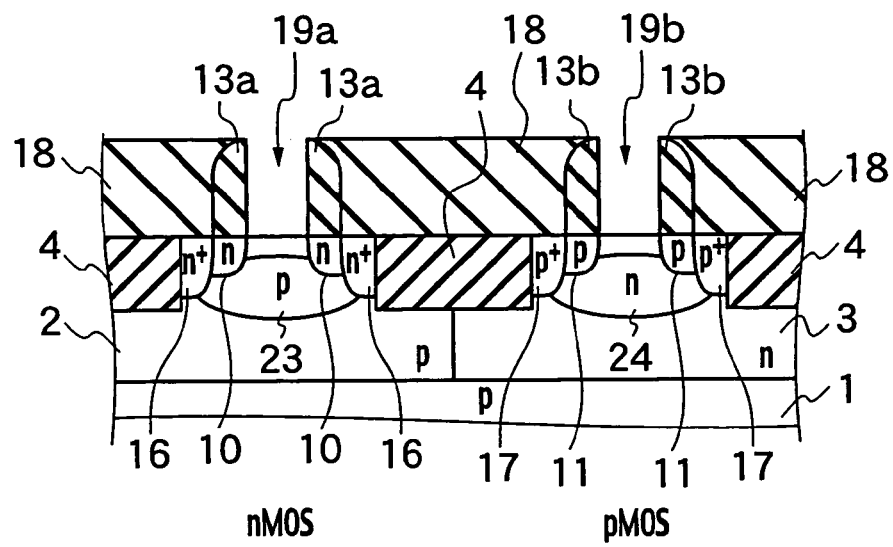
Figure 32:
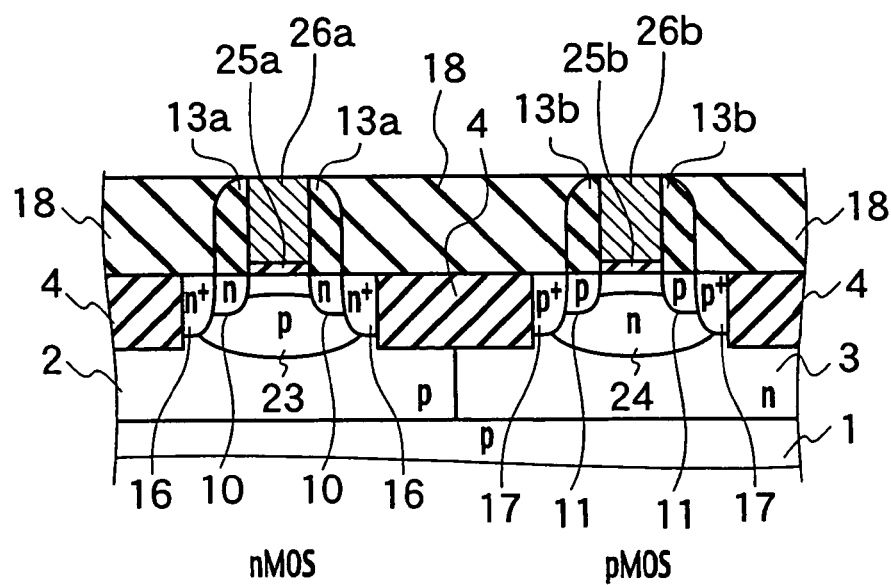

As shown in FIG. 31, the second dummy gates 66a, 66b, and the first dummy gates 5a, 5b are each selectively removed by a hydrogen phosphate (H$_3$PO$_4$) based, or hydrogen fluoride (HF) based etching solution, forming the openings 19a, 19b in the interlevel insulating film 18. A high-k film such as hafnium silicate (HfSiO) and a refractory metal film such as W are sequentially deposited on top of the surface of the semiconductor substrate 1. Thereinafter, the high-k film and the refractory metal film on top of the interlevel insulating film 18 are removed and planarization is executed by CMP or the like. In this manner, gate insulating film 25a, 25b, and gate electrodes 26a, 26b, are selectively formed in the interlevel insulating film 18, as shown in FIG. 32. In the second embodiment, the activation annealing of the channel regions 23, 24, the extension regions 10, 11, and the source-drain regions 16, 17 is executed in the last high temperature process in the manufacture of a semiconductor device.

The In implanted layer receives light from the flash lamp only once. After the activation annealing of In, there are no processes having temperatures above 500° C. According to the second embodiment it is therefore possible to prevent a decrease in the activation rate of In. Also in the second embodiment, annealing of an impurity implanted layer is executed without the use of poly-Si light absorption films used to absorb visible light of the flash lamp. Because there is no light absorption film in upper regions of the semiconductor substrate 1, it is possible to directly irradiate and thus heat the semiconductor substrate 1. Further, for the flash lamp light, the absorption coefficient of the Si$_3$N$_4$ film and the SiO$_2$ film of the dummy gate patterns 56a, 56b, and the interlevel insulating film 18 is roughly 0. Thus, it is possible to transmit energy to the semiconductor substrate 1 without a large light energy loss for the flash lamp light. Also, because a light absorption film is not used therein, a stripping process of the light absorption film after an impurity activation annealing processes is unnecessary. Therefore, it is possible to suppress increases in manufacturing costs and losses of manufacturing yield.

THIRD EMBODIMENT

Figure 33:
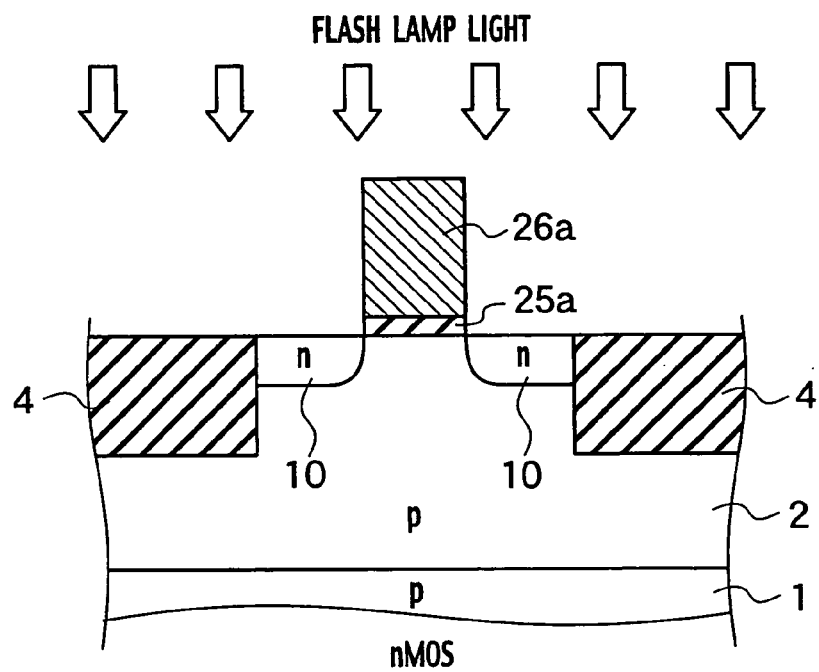
FIG. 33 is a cross sectional view of a semiconductor device showing an example of an impurity doping method according to a third embodiment of the present invention.

In an impurity doping method used in a manufacturing method of a semiconductor device according to a third embodiment of the present invention, after forming a gate insulating film 25a of a high-k film such as HfSiNO and a gate electrode 26a of a refractory metal film such as W, activation annealing of impurity implanted layers such as extension regions 10 is executed using a flash lamp light, as shown in FIG. 33.

The current activation of ion implanted impurities has been executed by annealing in a furnace, or by RTA using a halogen lamp. However, in the presently most widely used RTA, temperature elevation speed is at most approximately 250° C./s, and temperature reduction speed is at most approximately 90° C./s. For example, the required time for elevating from room temperature to 1000° C. is four s. And the time required for reducing from 1000° C. to a sufficiently low temperature is ten s. In RTA, the time in which annealing subjects are exposed to temperatures of over 900° C. is long, which makes it impossible to maintain film integrity of a high-k film used for a gate insulating film, thus leading to degeneration thereof. As a result, an insulating film having low leak current density cannot be attained. And a metal film used for a gate electrode also takes on constraints. For example, when exposed to high annealing temperatures for a long period of time, the metal film of the gate electrode will undergo a change in integrity. Also, metal atoms of the gate electrode will diffuse, penetrating into the underlying gate insulating film or Si semiconductor substrate surface. As a result, electrical properties such as threshold voltage of a MOS transistor may change.

On the other hand, when annealing by a flash lamp using Xe or the like, the period of time over which a light source illuminates is extremely short as 100 ms and below. Also, because the main illumination wavelength falls in the range of visible light, the light penetration length is limited. Therefore, only regions near surfaces exposed to the light of the flash lamp will be heated. For example, impurity implanted layers are formed on the semiconductor substrate 1 under the conditions with a B ion acceleration energy of 10 keV and an implant dose of $5\times10^{15}$ cm$^{-2}$. During pre-heating the semiconductor substrate 1 at 450° C., activation annealing is executed by irradiation of flash lamp light at an energy density of 23 J/cm$^2$ to 28 J/cm$^2$. As a comparison, activation annealing of impurity implanted layers is executed using a cap layer of W with a thickness of approximately 100 nm provided on a surface of a semiconductor substrate.

Figure 34:
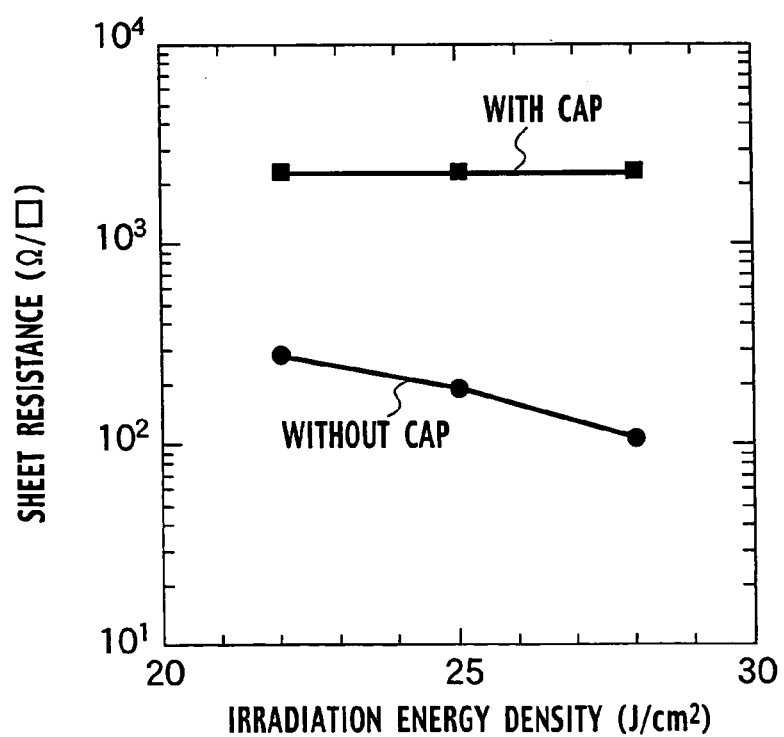
FIG. 34 is a diagram showing an example of the dependency of sheet resistance of an impurity implanted layer on the irradiation energy density.

As shown in FIG. 34, in a case without a cap layer, sheet resistance of activated impurity implanted layers decreases from approximately 300 Ω/□ to approximately 100 Ω/□, along with an increase of irradiation energy density. For example, a sheet resistance value of 100 Ω/□ corresponds to sheet resistance provided by RTA with 1000° C. for ten s. On the other hand, when flash lamp annealing is executed with a cap layer, a sheet resistance value is very high as approximately 3000 Ω/□. Sheet resistance values are also not dependant on irradiation energy densities of the flash lamp. For example, a sheet resistance value of 3000 Ω/□ corresponds to sheet resistance provided by a heating process at approximately 500° C., which is the deposition temperature in W CVD. Stated plainly, when the cap layer is used, it is shown that the activation of the impurity implanted layers is governed by the deposition temperature of W. Flash lamp light is virtually completely reflected at the W cap layer, preventing a sufficient amount of heat needed for activation of impurity implanted layers underneath the cap layer from being transmitted. In this manner only regions near surfaces exposed to the light of the flash lamp will be heated.

In the third embodiment, because a flash lamp that irradiates in the extremely short time of 100 ms or less, heated regions are limited to regions near the surface of the semiconductor substrate 1. Further, flash lamp light is irradiated on the surface of the semiconductor substrate 1 with the gate electrode 26a of the metal film. Since flash lamp light is reflected at a surface of a metal film, heat does not reach regions within the gate electrode 26a. As a result, there is no worry of metal atoms diffusing and penetrating to locations such as the gate insulating film 25a or the p-well 2 underneath the gate electrode 26a. It is thus possible to suppress degeneration of the gate insulating film 25a of high-k material, which has poor heat resistance. Thus, with benefit of properties of the gate insulating film 25a of a high-k film and the gate electrode 26a of a metal film, it is possible to easily manufacture a high performance transistor responding to demands of device miniaturization with high reliability.

The aspect of the third embodiment in which activation annealing of impurity implanted layers is carried out with the gate insulating film 25a and the gate electrode 26a formed thereon differs from the first embodiment. Other aspects of the third embodiment are identical to the first embodiment. Thus, redundant description will be omitted thereof.

Next, a manufacturing method of a semiconductor device according to the third embodiment of the present invention will be described using a manufacturing process of a CMOS transistor, which is a basic element of a semiconductor device, as an example.

As shown in FIG. 35, a p-well 2 is formed in an n-MOS region of a p-type Si semiconductor substrate 1, and an n-well 3 is formed in a p-MOS region of the semiconductor substrate 1. STIs 4 are formed to surround the p-well 2 and the n-well 3. The n-MOS region and the p-MOS region, which serve as element regions, are separated by the STIs 4. A high-k film such as HfSiNO is deposited on top of a surface of the semiconductor substrate 1. A metal film such as W is deposited on top of the high-k film. The metal film and the high-k film are patterned to form gate insulating films 25a, 25b and gate electrodes 26a, 26b in the p-well 2 and the n-well 3 respectively, as shown in FIG. 36. Further, before depositing the metal film, it is desirable to deposit a TiN film above the high-k film as a reaction prevention film by CVD.

The p-MOS region of the semiconductor substrate 1 is coated with a resist film, and ions of an n-type impurity such as As are selectively implanted into the n-MOS region. The resist film on the p-MOS region is then stripped away. The n-MOS region of the semiconductor substrate 1 is coated with a resist film, and ions of a p-type impurity such as B are selectively implanted into the p-MOS region. The resist film on the n-MOS region is then stripped away. As a result, impurity implanted layers 8 adjacent to both ends of the gate insulating film 25a, and impurity implanted layers 9 adjacent to both ends of the gate insulating film 25b are formed, as shown in FIG. 37. The conditions of ion implantation are an acceleration energy of 1 keV and an implant dose of $1 \times 10^{15}$ cm$^{-2}$ for As, and an acceleration energy of 2 keV and an implant dose of $1 \times 10^{15}$ cm$^{-2}$ for B, respectively.

The semiconductor substrate 1 is placed on the susceptor 31 of the annealing apparatus shown in FIG. 1. The semiconductor substrate 1 is pre-heated from the bottom surface thereof to 450° C. for example, by the heating source 32 of the susceptor 31. While maintaining a pre-heating temperature of 450° C. on the semiconductor substrate 1, the surface of the semiconductor substrate 1 is irradiated with flash lamp light from the light source 38 under conditions of a pulse width of 1 ms and irradiation energy density of 30 J/cm$^2$. By activation annealing, B and As atoms are moved to reside substitutional lattice sites and activated during recrystallization of the damaged layers induced upon the impurity implanted layers 8 and 9 by ion implantation. As a result, an n-type extension region 10 and a p-type extension region 11 are respectively formed between both ends of the gate insulating films 25a, 25b and the STIs 4, as shown in FIG. 38.

Figure 39:
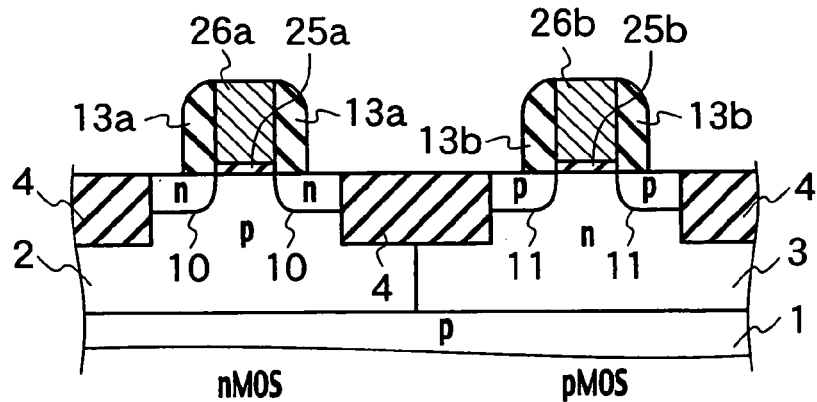

Insulating films made from SiO$_2$ and Si$_3$N$_4$ are sequentially deposited on top of the semiconductor substrate 1 by LPCVD. The insulating films of SiO$_2$ and Si$_3$N$_4$ are then selectively removed by directional etching such as RIE. As a result, the insulating films are selectively left on sides of the gate electrodes 26a, 26b and the gate insulating films 25a, 25b to form sidewall spacers 13a and 13b, which are multi-layered structures of the SiO$_2$ film and the Si$_3$N$_4$ film, as shown in FIG. 39.

Figure 40:
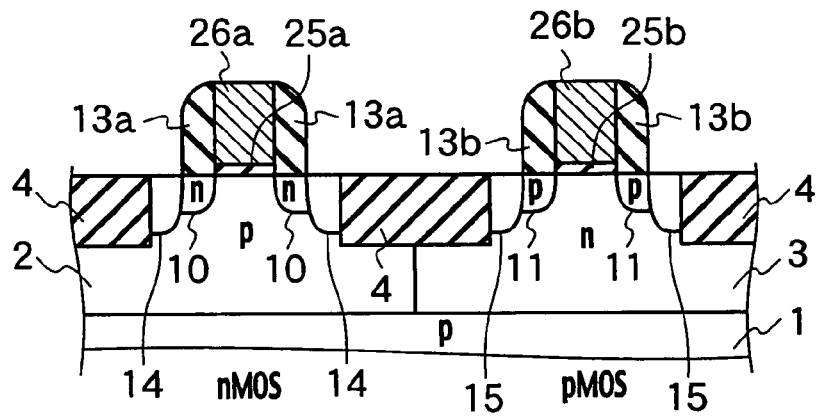

The p-MOS region is coated with a resist film, and ions of an n-type impurity such as P are selectively implanted into the n-MOS region using the gate electrode 26a and the sidewall spacer 13a as a mask. The resist film on the p-MOS region is then stripped away. The n-MOS region of the semiconductor substrate 1 is coated with a resist film, and ions of a p-type impurity such as B are selectively implanted into the p-MOS region using the gate electrode 26b and the sidewall spacer 13b as a mask. The resist film on the n-MOS region is then stripped away. The conditions of ion implantation are an acceleration energy of 15 keV and an implant dose of $3 \times 10^{15}$ cm$^{-2}$ for P, and an acceleration energy of 4 keV and an implant dose of $3 \times 10^{15}$ cm$^{-2}$ for B, respectively. As a result, impurity implanted layers 14, 15 implanted with P and B ions respectively, are formed between both ends of the sidewall spacers 13a, 13b and the STIs 4, as shown in FIG. 40. The impurity implanted layers 14, 15 are respectively formed at a depth of approximately 100 nm, which is deeper than the depth of the extension regions 10, 11.

Figure 41:
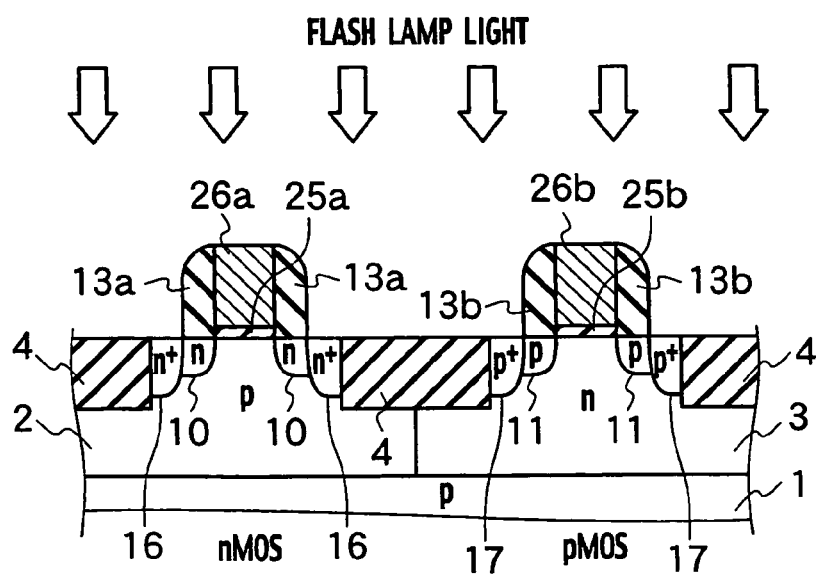

The semiconductor substrate 1 is placed on the susceptor 31 of the annealing apparatus shown in FIG. 1. The semiconductor substrate 1 is pre-heated from the bottom surface thereof to 450° C. for example, by the heating source 32 of the susceptor 31. While maintaining a pre-heating temperature of 450° C. on the semiconductor substrate 1, the top surface of the semiconductor substrate 1 is irradiated with flash lamp light from the light source 38 under conditions of a pulse width of 1 ms and irradiation energy density of 30 J/cm$^2$. As a result, an n$^+$ type source-drain region 16 is formed between both ends of the sidewall spacer 13a and the STIs 4 to contact the extension region 10, as shown in FIG. 41. Additionally, a p$^+$ type source-drain region 17 is formed between both ends of the sidewall spacer 13b and the STIs 4 to contact the extension region 11.

Thereinafter, an interlevel insulating film such as $SiO_2$ is formed on the semiconductor substrate 1 by normal pressure CVD at a deposition temperature of 400° C., for example. Contact holes are opened in the interlevel insulating film, and wiring is formed to the source-drain regions 16, 17 and the gate electrodes 26a, 26b, thus fabricating a semiconductor device.

In the third embodiment, metal film is used as the gate electrodes 26a, 26b. By using metal film, it is possible to prevent gate depletion that has been problematic for poly-Si gate electrodes. It also is possible to execute activation annealing of impurities implanted into the semiconductor substrate 1 at temperatures above 900° C. in an extremely short period of time. Therefore, it is possible to suppress the impurity diffusion caused by activation annealing, and to form a shallow pn junction. Further, when a metal material having a low melting point such as aluminum (Al) is used for the gate electrodes 26a, 26b, it is acceptable to deposit a light absorption layer above the gate electrodes 26a, 26b as needed before annealing.

Additionally, various damascene processes for forming a metal gate electrode are proposed, as examples of applying a high-k gate insulating film and a metal gate electrode to MOS transistors, in the disclosure of Japanese Patent Laid-Open Application No. 2000-150668. In the damascene process, it is necessary to form gate insulating films and gate electrodes as dummy patterns. And when the purpose of a dummy pattern has been fulfilled, the dummy pattern therein must be removed. Thus, the problems of lowered manufacturing yields and increasing manufacturing costs arise from an increase in the number of processes inherent in the manufacture of a semiconductor device. According to the third embodiment, there is no need for damascene processes using dummy patterns, and it is possible to manufacture a MOS transistor having a high-k gate insulating film and a metal gate electrode using usual processes.

OTHER EMBODIMENTS

In the first through third embodiments of the present invention, a Xe flash lamp is used as the light source 38 of FIG. 1. However, the light source 38 is not limited being only a Xe flash lamp. Light sources that are capable of high intensity illumination, such as flash lamps using other rare gas, mercury, hydrogen, and the like, lasers including an excimer laser, a YAG laser, a carbon monoxide (CO) laser, a carbon dioxide ($CO_2$) laser, and the like, and a Xe arc discharge lamp are also acceptable for use as the light source 38.

Additionally, a high-k film of HfSiON or HfSiO is used as a gate insulating film in a MOS transistor in the first through third embodiments of the present invention. However, a gate insulating film is not limited. It is also possible to use an oxide film such as an $SiO_2$ film and an aluminum oxide ($Al_2O_3$) film as a gate insulating film. It is also possible to use high-k dielectrics and ferroelectrics, which have poor heat resistance, such as a titanium oxide ($TiO_2$) film, a tantalum oxide ($Ta_2O_5$) film, a hafnium oxide ($HfO_2$) film, a zirconium oxide ($ZrO_2$) film, a palladium oxide (PdO) film, a lanthanum oxide ($La_2O_3$) film, a barium strontium titanium oxide ($(Ba, Sr)TiO_3$) film, and the like. Also, not only an oxide film, but a nitride film, an oxynitride film, and a silicate film of Si, Al, Ti, Ta, Hf, Zr, La, and Pd, can also be used as gate insulating films of MIS transistors. Further, it is acceptable to use not only a single layer film, but also a composite layer film including at least one of the oxide film, the nitride film, the oxynitride film, and the silicate film. In addition, a metal film of W is used as the gate electrode of MOS transistors in the first through third embodiments of the present invention. However, a metal film is not limited. It is also acceptable to use at least one of metal such as Al, refractory metals such as Ti, Zr, Hf, vanadium (V), niobium (Nb), Ta, molybdenum (Mo), and transition metals such as ruthenium (Ru), platinum (Pt), nickel (Ni), cobalt (Co), as material for the gate electrode. Additionally, It is acceptable to use nitride, nitrided silicide, and carbide of refractory metals or transition metals as material for the gate electrode. It is also acceptable to use silicide, germanide, and silicide germanide of Al, Ti, Zr, Hf, V, Nb, Ta, Mo, Ru, Pt, Ni, or Co as material for the gate electrode.

Various modifications will become possible for those skilled in the art after storing the teachings of the present disclosure without departing from the scope thereof.

What is claimed is:

1. A method for manufacturing a semiconductor device, comprising:

forming a first impurity implanted layer in a semiconductor substrate by selectively implanting ions of a first impurity;

forming a dummy pattern on a surface of the semiconductor substrate above the first impurity implanted layer;

forming a second impurity implanted layer in the semiconductor substrate by implanting ions of a second impurity using the dummy pattern as a mask;

burying an interlevel insulating film on the surface of the semiconductor substrate so as to planarize the interlevel insulating film at the level of the dummy pattern, a difference in refraction indexes of the dummy pattern and the interlevel insulating film having a maximum of one;

activating ions of the first and second impurities by irradiating the surface of the semiconductor substrate with pulsed light having a pulse width in a range of approximately 0.1 ms to 100 ms;

forming an opening by selectively removing the dummy pattern; and forming a gate insulating film and a gate electrode on the exposed surface of the semiconductor substrate.

2. The method of claim 1, wherein the dummy pattern is a silicon nitride film, and the interlevel insulating film is a silicon oxide film.

3. The method of claim 1, wherein the first impurity is indium.

4. The method of claim 1, wherein the gate insulating film includes at least one of an oxide film, a nitride film, an oxynitride film, and a silicate film; and wherein each of the oxide film, the nitride film, the oxynitride film, and the silicate film includes at least one of silicon, aluminum, titanium, tantalum, hafnium, zirconium, lanthanum, and palladium.

5. The method of claim 1, wherein the gate electrode includes at least one of a metal material including aluminum, refractory metals, or transition metals.

6. The method of claim 6, wherein the gate electrode includes one of a nitride film, a nitrided silicide film, a carbide film, a silicide film, a germanide film, and a silicide germanide film.

7. The method of claim 1, wherein the light is irradiated at an irradiation energy density in a range of approximately 5 $J/cm^2$ to 100 $J/cm^2$.

8. The method of claim 1, wherein the semiconductor substrate is irradiated by the light while maintaining a temperature in a range of approximately 300° C. to 600° C.

9. The method of claim 1, wherein the light is one of a flash lamp light, a laser light, and an arc discharge lamp light.

10. A method for manufacturing a semiconductor device, comprising:
forming a gate insulating film on a semiconductor substrate;
forming a gate electrode including a metal material on the gate insulating film; forming an impurity implanted layer in the semiconductor substrate by selectively implanting ions of an impurity using the gate electrode and the gate insulating film as a mask; and
activating ions of the impurity by irradiating a surface of the semiconductor substrate with a pulsed light at a pulse width in a range of approximately 0.1 ms to 100 ms.

11. The method of claim 10, wherein the gate insulating film includes at least one of an oxide film, a nitride film, an oxynitride film, and a silicate film; and wherein each of the oxide film, the nitride film, the oxynitride film, and the silicate film includes at least one of silicon, aluminum, titanium, tantalum, hafnium, zirconium, lanthanum, and palladium.

12. The method of claim 10, wherein the metal material includes at least one of aluminum, refractory metals, or transition metals.

13. The method of claim 10, wherein the gate electrode includes one of a nitride film, a nitrided silicide film, a carbide film, a suicide film, a germanide film, and a silicide germanide film.

14. The method of claim 10, wherein the light is irradiated at an irradiation energy density in a range of approximately 5 J/cm$^2$ to 100 J/cm$^2$.

15. The method of claim 10, wherein the semiconductor substrate is irradiated by the light while maintaining a temperature in a range of approximately 300° C. to 600° C.

16. The method of claim 10, wherein the light is one of a flash lamp light, a laser light, and an arc discharge lamp light.

17. A method for manufacturing a semiconductor device, comprising:
forming a dummy pattern on a surface of a semiconductor substrate;
forming a first impurity implanted layer in the semiconductor substrate by implanting first impurity ions using the dummy pattern as a mask;
burying an interlevel insulating film on the surface of the semiconductor substrate so as to planarize the interlevel insulating film at the level of the dummy pattern;
forming an opening by selectively removing the dummy pattern to expose part of the surface of the semiconductor substrate;
forming a second impurity implanted layer in the semiconductor substrate by implanting indium ions as second impurity ions through the opening;
activating the first and second impurity ions by irradiating the surface of the semiconductor substrate with pulsed light through the opening and the interlevel insulating film at a pulse width in a range of approximately 0.1 ms to 100 ms; and
forming a gate insulating film and a gate electrode on the surface of the semiconductor substrate exposed in the opening.

18. The method of claim 17, wherein the semiconductor substrate is irradiated by the light at an irradiation energy density in a range of approximately 5 J/cm$^2$ to 100 J/cm$^2$ while maintaining a temperature in a range of approximately 300° C. to 600° C.

19. The method of claim 10 wherein the pulsed light comprises light from a flash lamp.

20. The method of claim 17, wherein the pulsed light comprises light from a flash lamp.

* * * * *